(12) United States Patent
Tanaka et al.

(10) Patent No.: US 7,939,838 B2
(45) Date of Patent: May 10, 2011

(54) SEMICONDUCTOR LIGHT EMITTING DEVICE WITH TRANSPARENT SUBSTRATE AND REFLECTIVE SLOPE

(75) Inventors: Shinichi Tanaka, Meguro-ku (JP);
Naochica Horio, Meguro-ku (JP);
Munehiro Kato, Meguro-ku (JP);
Satoshi Tanaka, Meguro-ku (JP)

(73) Assignee: Stanley Electric Co., Ltd., Tokyo (JP)

( * ) Notice: Subject to any disclaimer, the term of this patent is extended or adjusted under 35 U.S.C. 154(b) by 944 days.

(21) Appl. No.: 11/606,379

(22) Filed: Nov. 30, 2006

(65) Prior Publication Data
US 2007/0176188 A1 Aug. 2, 2007

(30) Foreign Application Priority Data

Dec. 1, 2005 (JP) .................................. 2005-348273

(51) Int. Cl.
*H01L 33/00* (2010.01)
(52) U.S. Cl. ................ 257/91; 257/80; 257/79; 257/93; 257/88; 257/E33.001
(58) Field of Classification Search .................... 257/80, 257/79
See application file for complete search history.

(56) References Cited

U.S. PATENT DOCUMENTS
2005/0253161 A1* 11/2005 Horio et al. .................... 257/100
2007/0228393 A1* 10/2007 Yoneda ........................... 257/79

FOREIGN PATENT DOCUMENTS
| JP | 11-150300 | * | 6/1999 |
| JP | 2002-353504 | * | 12/2002 |
| JP | 3540605 | * | 4/2004 |
| JP | 2005-039197 | * | 2/2005 |

* cited by examiner

*Primary Examiner* — Wai-Sing Louie
*Assistant Examiner* — Eva Yan Montalvo
(74) *Attorney, Agent, or Firm* — Chen Yoshimura LLP

(57) ABSTRACT

A semiconductor light emitting device includes a semiconductor layer having a recess extending downwardly from a top surface thereof along a pattern of a closed line so that said recess defines and encloses a region of the semiconductor layer that emits light, said semiconductor layer having a downward slope in at least a portion of its side end face located outside the closed line pattern of said recess; a first electrode on said downward slope of the side end face of the semiconductor layer and electrically in contact with a portion of said semiconductor layer, wherein said first electrode downwardly reflects light that is emitted by said semiconductor layer and that reaches the first electrode; and a second electrode electrically in contact with a portion of said semiconductor layer located inside the closed line pattern of said recess.

19 Claims, 13 Drawing Sheets

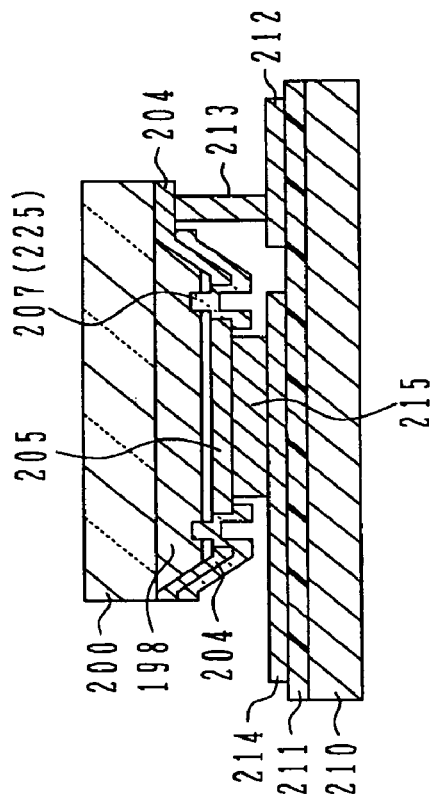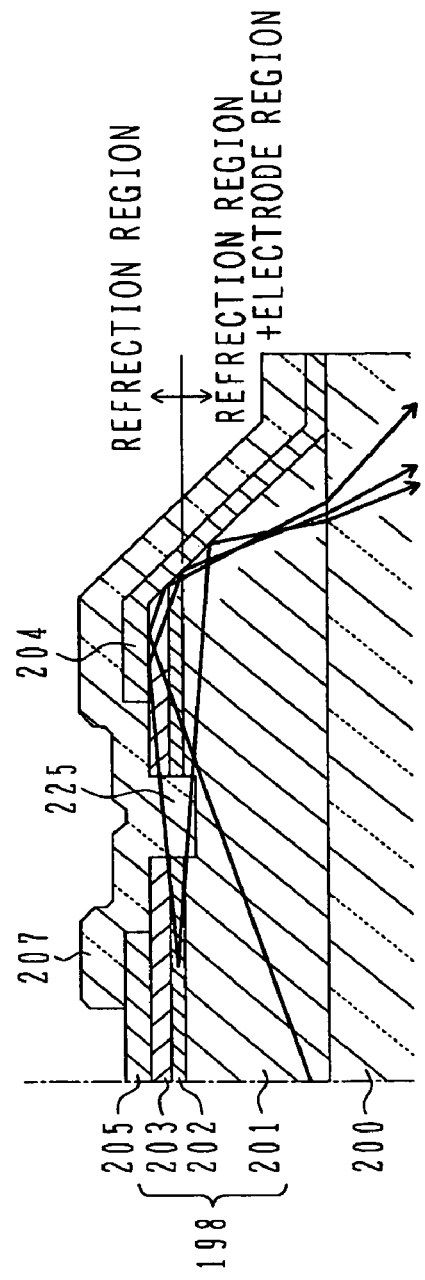

FIG. 7

COMPARISON OF LED DEVICE CHARACTERISTICS

| ITEM | COMPARATIVE LED 1 | SECOND EMBODIMENT LED | THIRD EMBODIMENT LED | COMPARATIVE LED 2 | FIRST EMBODIMENT LED |
|---|---|---|---|---|---|
| DIE SIZE (RATED SIZE mm) | □ 0.3 | □ 0.3 | □ 0.3 | □ 1 | □ 1 |
| NUMBER OF OPTICAL EMISSION REGIONS | 1 | 1 | 1 | 9 | 9 |
| CURRENT (mA) | 20 | 20 | 20 | 350 | 350 |
| DRIVE VOLTAGE (V) | 3.2 | 3.2 | 3.2 | 3.3 | 3.2 |
| TOTAL LIGHT FLUX (NORMALIZED%) | 100 | 110 | 110 | 100 | 130 |
| FRONT LIGHT FLUX RATIO (%) | 55 | 85 | 85 | 65 | 85 |

…

SEMICONDUCTOR LIGHT EMITTING DEVICE WITH TRANSPARENT SUBSTRATE AND REFLECTIVE SLOPE

CROSS REFERENCE TO RELATED APPLICATION

This application is based on and claims priority of Japanese Patent Application No. 2005-348273 filed on Dec. 1, 2005, the entire contents of which are incorporated herein by reference.

BACKGROUND OF THE INVENTION

A) Field of the Invention

The present invention relates to a semiconductor light emitting device and its manufacture method.

B) Description of the Related Art

Since the advent of high outputs of light emitting diodes (LEDs), the use field of LEDs is expanding day after day to various fields ranging from a device indicator lamp, an outdoor display lamp, backlight illumination for a liquid crystal display, to indoor illumination. In these markets, LEDs are desired to have still higher outputs.

High outputs of LEDs have been realized by improvement on an internal quantum efficiency, improvement on a light extraction efficiency, reduction in a package loss, improvement on device heat radiation and the like.

A high output of a white LED is strongly desired nowadays. However, an internal quantum efficiency of InGaN based LEDs as light sources has reached 70%, and improvement in this direction is considered to be approaching its limit. Therefore, improvement on the light extraction efficiency has been extensively studied.

FIGS. 9A and 9B are schematic cross sectional views of an LED of a flip-chip structure (a structure in which light is output from a side opposite to a substrate surface on which an LED optical emission layer is formed).

Reference is made to FIG. 9A. On a sapphire substrate 20, a nitride semiconductor layer 21 is formed which is a semiconductor optical emission layer containing InGaN. Formed on the nitride semiconductor layer 21 are an n-side electrode 22 for supplying electrons to the nitride semiconductor layer 21 and a p-side electrode 23 for supplying holes to the nitride electrode layer. An insulating protective film 24 is formed surrounding both the electrodes 22 and 23.

The n- and p-side electrodes 22 and 23 are connected to n- and p-side lead electrodes 34 and 32 respectively via conductive connection members 33. Both the lead electrodes 32 and 34 are formed on an insulating film 31 formed on a support substrate 30.

The p-side electrode 23 is made of material such as Ag having a high optical reflectivity, and reflects directly or indirectly light emitted from the nitride semiconductor layer 21. Reflected light is output from the sapphire substrate 20 side.

The sapphire substrate 20 is transparent with respect to light emitted from the nitride semiconductor layer 21. Since its optical absorption loss is small, the sapphire substrate, for example, is used as a good window member.

Heat dissipation can be enhanced by bonding the support substrate 30 to a sub-mount, a frame, a stem, a heat sink, a wiring substrate and the like. Large current and high output operations are therefore possible.

Reference is made to FIG. 9B. FIG. 9B is a cross sectional view taken along the line 9B-9B shown in FIG. 9A. The p-side electrode 23 is disposed generally in a central area of LED so that light from the nitride semiconductor layer 21 can be reflected efficiently.

FIG. 10 illustrates optical output paths of light emitted from LED of the flip-chip structure shown in FIGS. 9A and 9B.

In FIG. 10, the structure of the nitride semiconductor layer 21 is shown in more detail than FIG. 9A, for the convenience of explanation. The nitride semiconductor layer 21 includes an optical emission layer 41 for emitting light through recombination of holes and electrons and n-type and p-type nitride semiconductor layers 40 and 42, respectively, sandwiching the optical emission layer 41. The n-type nitride semiconductor layer 40 is electrically connected to the n-side electrode, and the p-type nitride semiconductor layer 42 is electrically connected to the p-side electrode 23.

Optical output paths are classified into four types: paths formed by direct light emitted from the optical emission layer 41 directly toward the sapphire substrate 20 side; paths formed by reflection light reflected by the p-side electrode 23 and emitted toward the sapphire substrate 20 side (these two lights are referred to as "front emission light"); paths formed by substrate end face emission light emitted from an end face (side end face) of the sapphire substrate 20; and paths formed by nitride semiconductor layer end face emission light emitted from an end face (side end face) of the nitride semiconductor layer 21.

The nitride semiconductor layer 21 contains GaN crystal. The refractive index of GaN crystal around an emission wavelength of 470 nm (in vacuum) is about 2.4, and a refractive index of sapphire is about 1.77. Therefore, the total reflection angle of light emitted from the optical emission layer 41 and propagating from the GaN layer to the sapphire substrate 20 is about 47.5°. It is herein assumed that the optical reflectivity of the p-side electrode 23 is 100%, the optical absorption factor of the nitride semiconductor layer 21 is 0%, and light emitted from one point of the optical emission layer 41 radiates omnidirectionally at an equal strength. In this case, calculations show that light capable of entering the sapphire substrate 20 is about 32.4% and light reflected at an interface between the sapphire substrate 20 and compound semiconductor layer 21 is 67.6%. Light that is unable to enter the sapphire substrate 20 becomes light propagating (being guided) in the nitride semiconductor layer 21 (hereinafter referred to as "propagation light").

The propagation light is reflected at an interface between the p-type nitride semiconductor layer 42 and p-side electrode 23 and at an interface between the sapphire substrate 20 and n-type nitride semiconductor layer 40, and propagates through the optical emission layer 41 between two reflections. This propagation light attenuates because of an optical reflection loss at a reflection surface and an inter-band optical absorption in the nitride semiconductor layer 21. The propagation light attenuates also because of optical absorption caused by other reasons (optical absorption at non-radiative centers of nitride semiconductor crystal itself and by crystal defects).

An LED having the structure shown in FIGS. 9A and 9B and manufactured in a size of about 1 mm² possesses some problems, such as a lowered light extraction efficiency, an inhomogeneous optical emission, a lowered power efficiency, an increased heat generation and the like.

The light extraction efficiency lowers as emission light from a nitride semiconductor layer end face (side end face) is reduced, for example, by attenuation by optical absorption by crystal defects in the nitride semiconductor layer (if a buffer layer to be described later is formed, optical absorption in the buffer layer is also included), by a reflection loss at an interface between the p-side electrode and p-type nitride semiconductor layer, by re-absorption in the optical emission layer and the like.

The inhomogeneous optical emission is caused if current supplied from the n-side electrode does not diffuse uniformly in the n-type nitride semiconductor layer because of a large device size, but flows more in a region near the electrode.

The lowered power efficiency is caused, for example, by a power loss (power transmission loss) caused by a longer distance of current supplied from the n-side electrode and flowing in the n-type nitride semiconductor layer. Further, since the power loss is transformed into heat, the heat generation becomes large. The power loss is generated also by an increase in resistance components caused by narrowing a relative electrode area, by a lowered optical emission efficiency due to uneven current distribution, and by other reasons.

FIG. 11 is a schematic cross sectional view showing an LED lamp. The LED lamp shown comprises semiconductor light emitting diodes 300 shown in FIGS. 9A and 9B.

The semiconductor light emitting diode 300 is placed on a lamp substrate 303. p- and n-side lead electrodes of the semiconductor light emitting diode 300 are connected to p- and n-side lamp lead electrodes 304 and 305 to receive an electric power from an external power source.

The lamp substrate 303 has a reflection horn 301 disposed around the semiconductor light emitting diode 300. The semiconductor light emitting diode 300 and reflection horn 301 are covered with translucent resin 302 on the lamp substrate 303.

As understood from the description made with reference to FIG. 10, light emitted in the semiconductor light emitting diode 300 is output from the sapphire substrate surface of the semiconductor light emitting diode 300 and from an end face (side face) of the semiconductor light emitting diode 300. In order to increase the optical output, light output from the end face (side face) of the semiconductor light emitting diode 300 is guided to the upper surface of the LED lamp by using the reflection horn 301, for example.

Since the reflection horn 301 is disposed whose shape greatly influences an output and optical paths of the LED lamp, there arise some problems, such as restrictions on the size and shape of the LED lamp. Further, light output from the surface of the n-type nitride semiconductor layer on the electrode side, and light output from the optical emission layer and an end face of the p-type nitride semiconductor layer become stray light and do not contribute to improving the LED lamp output.

In order to improve the light extraction efficiency of a flip-chip LED, various structures have been proposed, such as a structure that a multi-layer reflection film is formed on an end face of an optical emission region (e.g., refer to JP-A-2002-353504), a structure that a reflection layer is formed on an end face from a semiconductor layer to a translucent substrate (e.g., refer to JP 3540605) and a structure that a reflection layer is formed on an inclined surface (e.g., refer to JP-A-2005-39197).

In order to improve the LED operation efficiency, a structure in which an n-side electrode is formed on the upper and side walls of an n-type nitride semiconductor layer, surrounding an optical emission region, has been proposed (e.g., refer to JP-A-HEI-11-150300).

JP-A-2002-353504 discloses an LED structure capable of improving the light extraction efficiency by minimizing a loss, at a mesa wall, of incident light having an angle from −10° to 30° relative to a substrate. However, this structure has a limit in the incident angle of light that can take advantages of the effect.

JP 3540605 discloses the invention of a light emitting diode having a structure in which a reflection electrode is disposed on an inclined surface extending from an n-type nitride semiconductor layer to a sapphire substrate and light emitted from an optical emission layer is reflected at the reflection electrode toward the substrate side. In this light emitting diode, since the reflection electrode is formed only on the n-type semiconductor layer and on the sapphire substrate, light leaks from the end faces of the optical emission layer and a p-type semiconductor layer.

JP-A-2005-39197 discloses an invention of a semiconductor light emitting diode having a structure in which light confined in semiconductor is output along a front side direction by using a reflection layer disposed on an inclined surface. In the semiconductor light emitting diode of this structure, since the reflection layer and an n-side electrode are formed separately, a space exists between the n-side electrode and reflection layer and there is leak light.

JP-A-HEI-11-150300 discloses an invention of a nitride semiconductor device presenting a high optical emission efficiency when current is injected into an optical emission layer. The optical emission efficiency is improved by broadening a contact area between the semiconductor layer and an electrode, but a light extraction efficiency is not improved.

SUMMARY OF THE INVENTION

An object of the present invention is to provide a semiconductor light emitting device having a high light extraction efficiency.

Another object of the present invention is to provide a manufacture method for a semiconductor light emitting device having a high light extraction efficiency.

According to one aspect of the present invention, there is provided a semiconductor light emitting device including a substrate having translucency; a semiconductor part formed over said substrate and comprising a first semiconductor layer of a first conductivity type over said substrate, an optical emission layer over said first semiconductor layer, and a second semiconductor layer of a second conductivity type over said optical emission layer, said semiconductor part including an optical emission region and an optical non-emission region, said optical emission region being defined inside a closed line pattern, in plan view, of a recess that downwardly extends through said second semiconductor layer and said optical emission layer and reaching said first semiconductor layer, and said optical non-emission region being separated from said optical emission region via said recess, wherein an side end of said optical non-emission region opposite to said recess has a downward slope towards said substrate in at least a portion of said side end; an insulating transparent member embedded in said recess; a first electrode electrically connected to said first semiconductor layer and formed on said downward slope of said side end of said optical non-emission region opposite to said recess; and a second electrode formed on said second semiconductor layer in said optical emission region, wherein light emitted from said optical emission layer is output generally downwardly on a side of said substrate.

In another aspect, the present invention provides a manufacture method for a semiconductor light emitting device, the method including (a) preparing a device substrate including a translucent substrate and a semiconductor part over said translucent substrate, said semiconductor part comprising a first semiconductor layer of a first conductivity type over said translucent substrate, an optical emission layer over said first semiconductor layer and a second semiconductor layer of a second conductivity type over said optical emission layer; (b) forming a recess along a first closed line pattern, in plan view, defined on said second semiconductor layer, said recess downwardly extending through said second semiconductor layer and said optical emission layer and reaching said first semiconductor layer; (c) forming a downward slope towards said translucent substrate in at least a portion of a side end face of said semiconductor part along a second closed line pattern, in plan view, defined on said second semiconductor layer, said second closed plan-view line pattern formed by the downward slope surrounding said first closed plan-view line pattern of said recess; (d) forming a first electrode electrically connected to said first semiconductor layer on said downward slope of said side end face of the semiconductor part; (e) forming a second electrode on said second semiconductor layer inside said first closed plan-view line pattern of said recess; and (f) filling said recess with a transparent member.

In another aspect, the present invention provides a semiconductor light emitting device, including a translucent substrate; and a plurality of semiconductor light emission parts over the substrate, each light emission part emitting light generally downwardly to an exterior through the substrate, the plurality of light emission parts being defined and separated by a lattice pattern of a V-shaped groove having a reflective surface to reflect, downwardly towards the substrate, light propagating laterally and incident upon the V-shaped groove, another reflective surface being provided in each semiconductor light emission part in an area including a center of the semiconductor light emission part to reflect, downwardly towards the substrate, light that is propagating upwardly and that is incident upon said another reflective surface.

In another aspect, the present invention provides a semiconductor light emitting device, including a semiconductor layer having a recess extending downwardly from a top surface thereof along a pattern of a closed line so that said recess defines and encloses a region of the semiconductor layer that emits light, said semiconductor layer having a downward slope in at least a portion of its side end face located outside the closed line pattern of said recess; a first electrode on said downward slope of the side end face of the semiconductor layer and electrically in contact with a portion of said semiconductor layer, wherein said first electrode downwardly reflects light that is emitted by said semiconductor layer and that reaches the first electrode; and a second electrode electrically in contact with a portion of said semiconductor layer located inside the closed line pattern of said recess.

According to the present invention, it is possible to provide a semiconductor light emitting device having a high light extraction efficiency.

Further, according to the present invention, it is possible to provide a manufacture method for a semiconductor light emitting device having a high light extraction efficiency.

BRIEF DESCRIPTION OF THE DRAWINGS

FIG. 2 is a schematic cross sectional view showing a semiconductor light emitting device according to a second embodiment.

FIG. 3 is a schematic cross sectional view showing some of the characteristic portions of the semiconductor light emitting devices of the first and second embodiments.

FIG. 7 is a table showing the characteristics of the semiconductor light emitting devices of the first to third embodiments and semiconductor light emitting devices of comparative examples.

DESCRIPTION OF THE PREFERRED EMBODIMENTS

FIGS. 1A to 1K are schematic diagrams illustrating a manufacture method for a semiconductor light emitting device according to a first embodiment. In the semiconductor light emitting device of the first embodiment, a semiconductor lamination layer is divided into a plurality of island regions by a partitioning groove having an inclined surface of a V-character shape. Additionally a separation groove is formed in each island region to have a closed plan-view line pattern and have a depth deeper than the optical emission layer. The area surrounded by the separation groove is an optical emission region, and the area outside the separation groove is an optical non-emission region. The separation groove is filled with transparent material to reduce optical reflection at the interface. An electrode is formed on the inclined surface of the V-shape separation groove to enhance optical reflection as well as to provide carriers. The other electrode is formed in the optical emission region.

The manufacture method for a semiconductor light emitting device of the first embodiment is divided roughly into processes of forming an optical emission part (to be described with reference to FIGS. 1A to 1F), processes of forming a support substrate part (sub-mount part) (to be described with reference to FIGS. 1G to 1H), and processes of forming a semiconductor light emitting device by bonding the optical emission part and support substrate part (to be described with reference to FIGS. 1I to 1K).

Figure 1A:
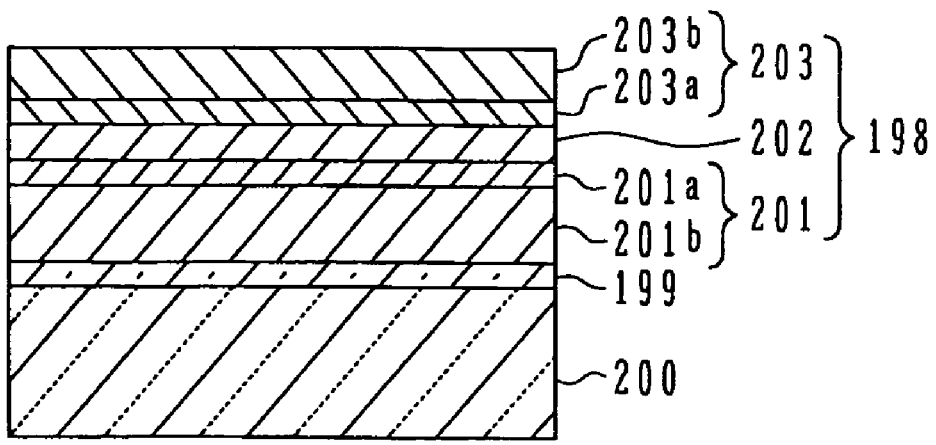
FIGS. 1A to 1K are schematic diagrams illustrating a manufacture method for a semiconductor light emitting device according to a first embodiment.

First, description will be made on the processes of forming the optical emission part. Reference is made to FIG. 1A. FIG. 1A is a schematic cross sectional view of a nitride semiconductor wafer. First, a semiconductor wafer such as shown in FIG. 1A is prepared. The semiconductor wafer is manufactured by forming on a transparent sapphire substrate 200 at least an n-type nitride compound semiconductor layer 201, an optical emission layer 202 and a p-type nitride semiconductor layer 203 by, for example, a metal organic vapor epitaxial (MOVPE) growth method or a molecular beam epitaxial (MBE) growth method.

The nitride semiconductor wafer is constituted of the optical emission layer 202 having, e.g., a multi-quantum well structure for optical emission through recombination of injected holes and electrons, and the n-type and p-type nitride semiconductor layers 201 and 203 sandwiching the optical emission layer 202. A lamination structure constituted of the n-type nitride semiconductor layer 201, optical emission layer 202 and p-type nitride semiconductor layer 203 is herein referred to as "a nitride semiconductor layer 198." The nitride semiconductor layer 198 (n-type nitride semiconductor layer 201) is formed directly on the translucent sapphire substrate 200 or indirectly via a buffer layer 199. A total thickness of the p-type nitride semiconductor layer 203 and optical emission layer 202 is, for example, 0.35 μm.

The n-type nitride semiconductor layer 201 is a layer for supplying electrons to the optical emission layer 202, and includes an n-type clad layer 201a formed on the optical emission layer 202 and an n-type contact layer 201b formed on the n-type clad layer. The p-type nitride semiconductor layer 203 is a layer for supplying holes to the optical emission layer 202, and includes a p-type clad layer 203a formed on the optical emission layer 202 and a p-type contact layer 203b formed on the p-type clad layer.

Figure 1B:
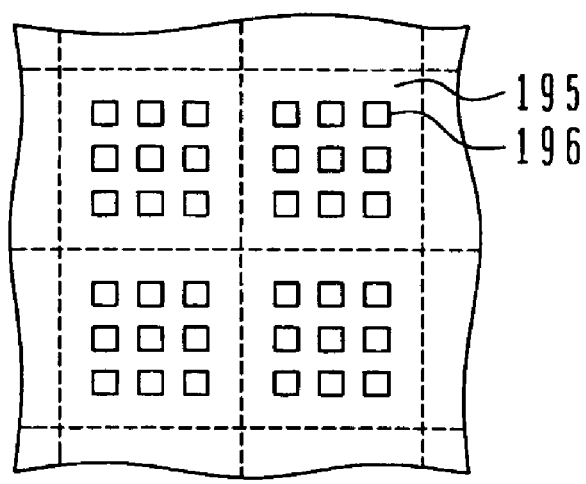

Reference is made to FIG. 1B. In this example, a plurality of optical emission parts 195 is defined on the nitride semiconductor wafer. The parts 195 will be eventually cut out to form separate optical emission parts. Each of the optical emission parts 195 has a plurality of light emission regions (e.g., nine regions).

Figure 1C:
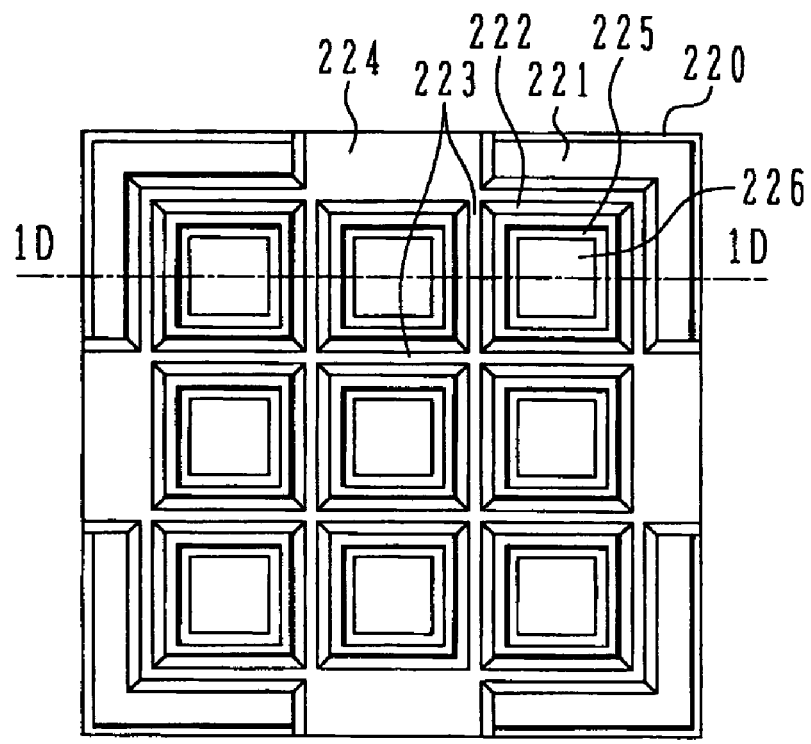

Reference is made to FIG. 1C. Grooves are formed in the prepared semiconductor wafer, as shown in FIG. 1C. FIG. 1C is a plan view showing a part that will become a light emitting device in a later process (single optical emission part 195).

As shown in FIG. 1C, the optical emission part may be defined, for example, in a rectangular shape as viewed from the top. A contour groove 220 is a groove formed near each of the four corners of the rectangle along the periphery of the rectangle. An outer periphery frame recess 224 is formed in a central area of each side of the outer periphery of the rectangle, for example, between the opposite ends of the contour grooves 220.

In this embodiment, in the central areas (not in the outer peripheral areas) of the rectangular optical emission parts, a plurality of rectangular parts 226 are formed in a matrix of 3×3. A p-side electrode is formed at a later process above each rectangle part 226. Each of these small rectangular parts 226 will become an optical emission region at a later process.

An electrode separation groove 225 is formed at the periphery of each rectangle part 226. Additionally, a groove having a normal tapered side shape (side shape narrowing in width as it approach the substrate 200; V-character shaped groove) is formed at the periphery of the electrode separation groove 225. An island region is defined by the V-character shaped groove. Of the V-character shaped groove, a portion formed between adjacent rectangle parts 226 is referred to as a rectangle part partitioning groove 223. Of the V-character shaped groove, a portion formed at positions adjacent to the contour groove 220 is referred to as an outer periphery frame partitioning groove 222.

In each of the island region thus defined by V-shaped groove, the rectangle part 226 is an optical emission region, and the region defined between the electrode separation groove 225 and the V-character shaped groove is an optical non-emission region.

An L-character shaped outer periphery frame 221 is defined at each corner of the rectangle by the contour groove 220, the outer periphery frame partitioning groove 222 and the outer periphery frame recess 224. An n-side electrode exposing portion is formed at a later process on the outer periphery frame 221. The outer periphery frame 221 functions also as a support portion. The outer periphery frame recess 224 is also a region through which wirings are passed.

Figure 1D:
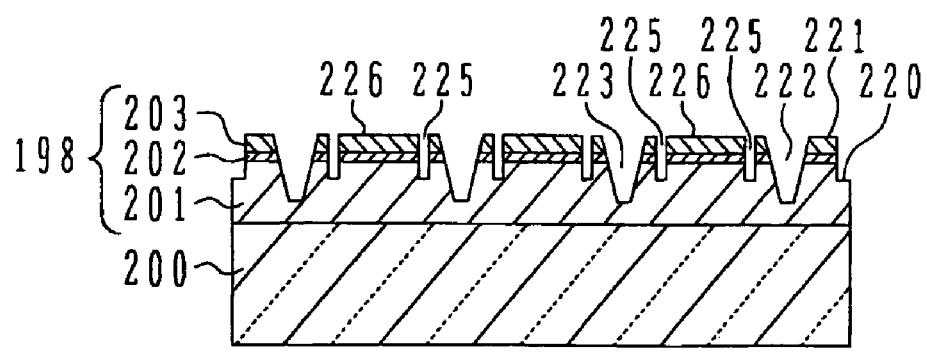

FIG. 1D is a cross sectional view taken along line 1D-1D shown in FIG. 1C. With reference to FIG. 1D, description will be made on a process of forming each part shown in FIG. 1C.

The above-described grooves are formed at two stages, for example. The first stage forms the contour groove 220 and electrode separation groove 225. The second stage forms the outer periphery frame partitioning groove 222, the rectangle part partitioning groove 223 and outer periphery frame recess 224, by a tapered etching to a depth where the n-type nitride semiconductor layer is left slightly, for example.

Details will be given in the following. First, a resist having openings corresponding the contour grooves 220 and electrode separation grooves 225 is formed on a prepared nitride semiconductor wafer, by photolithography using a mask or the like. Next, the p-type nitride semiconductor layer 203 and optical emission layer 202 and a surface layer of the n-type nitride semiconductor layer 201 in the openings are etched and removed by dry etching. Lastly the resist is washed and removed. In this manner, the contour grooves 220 and the electrode separation grooves 225 each having a depth exposing the n-type nitride semiconductor layer 201 are formed.

A depth of the electrode separation groove 225 is, for example, about 0.65 μm. This is because a total thickness of the p-type nitride semiconductor layer 203 and optical emission layer 202 is, for example, 0.35 μm. As a result, the electrode separation groove 225 is formed to a depth of 0.1 μm or deeper, e.g., about 0.3 μm of the n-type nitride semiconductor layer 201 as measured from the interface between the optical emission layer 202 and n-type nitride semiconductor layer 201. Therefore, the etching depth from the wafer surface is adjusted depending upon the lamination structure (thickness) of a nitride semiconductor wafer to be used. The width of the electrode separation groove 225 may be set to about 2 μm in accordance with the exposure resolution of a mask aligner used, for example.

Next, similar to the process of forming the contour grooves 220 and electrode separation grooves 225, a resist having openings with slanted opening edges is formed. The openings of the resist corresponds to the outer periphery frame partitioning grooves 222, the rectangle part partitioning grooves 223 and the outer periphery frame recesses 224. The patterned resist is used to etch underlying layers exposed in the openings to a depth where the n-type nitride semiconductor layer 201 is partially left.

The angle control of the slanted side face in the tapered grooves is performed in the following manner. A slope is formed on the sidewall of each opening of the resist by post exposure bake (PEB) of the resist material at a temperature lower than a predetermined temperature, followed by post bake shrink at the predetermined temperature after development. Thereafter, dry etching is performed by using this resist pattern to transfer the inclined sidewall shape of the resist to the underlying nitride semiconductor layer. The etching selection ratio between the nitride semiconductor layer and the resist can be controlled by adjusting the pressure condition of dry etching, the kinds of gasses, and the RF output, and the angle is controlled by a combination of these parameters.

The inclination angle is, for example, about 43° at the position of the optical emission layer 202, as measured from the surface of the substrate 200 as a reference. In order to facilitate output of light propagating (being guided) in the nitride semiconductor layer 198 to an exterior of the device, each inclination angle in the V-shape groove is preferably set to about 35° to about 50° as measured from the surface of the substrate 200 as a reference.

A clearance between the electrode separation groove 225 and V-character shape partitioning groove (outer periphery frame partitioning groove 222 and rectangle part partitioning groove 223) at the upper opening edge (surface of the p-type nitride semiconductor layer 203) is set, for example, to about 5 µm by considering a margin required for forming an n-type electrode at a later process.

The aspect ratio (depth 0.65/width 2.0=0.325) of the electrode separation groove 225 described with reference to FIG. 1D is small. Also, due to its shape, chemicals and washing liquid can be reached inside each V-character shape partitioning groove without problems. Therefore, processing irregularities in material filling, etching and washing in these grooves are unlikely to occur during the manufacture processes.

Figure 1E:
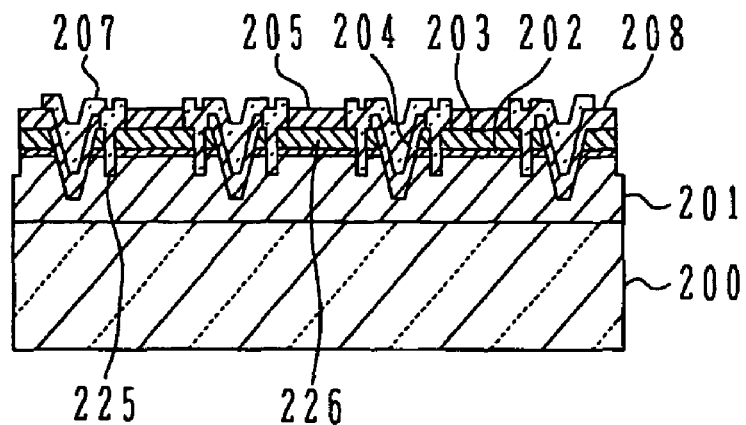

Next, p- and n-side electrodes and translucent insulating members are formed. Reference is made to FIG. 1E. First, a p-side electrode 205 is formed on the rectangle part 226. The p-side electrode 205 is made of material which reflects, for example, 80% or more of light that is emitted from the optical emission layer 202 and is perpendicularly incident upon the p-side electrode 205.

A resist having openings corresponding to a pattern of p-side electrodes 205 is formed on the rectangle parts 226 of the 3×3 matrix shape, by photolithography. Next, in this embodiment, platinum (Pt)/silver (Ag)/titanium (Ti)/Pt/gold (Au)/Pt/Au is deposited by electron beam deposition at a thickness of 1 nm/200 nm/100 nm/100 nm/100 nm/100 nm/200 nm. Then the deposited material on the surface other than the openings is removed by lift-off to form the p-side electrodes 205. A clearance between the electrode separation groove 225 and p-side electrode 205 is set to, for example, about 5 µm by considering a p-side electrode 205 forming precision. In this specification, notation of A/B/C means a lamination of an A layer, a B layer and a C layer in this order from the semiconductor crystal side.

The p-side electrode material is not limited to the above-described example. For example, the second layer may be made of rhodium (Rh). The first and second layers may be made of a lamination structure of Rh/Ag. It is preferable to use material having a high reflectivity relative to light emitted from the optical emission layer 202 and being capable of forming an ohmic contact with the p-type nitride semiconductor layer.

The p-side electrode material layer can have a sufficient ohmic contact without alloying. Even if alloying is performed, a good ohmic contact and a high optical reflectivity can be retained.

The film thickness of the fourth and succeeding layers of /Pt/Au/Pt/Au is preferably set by considering the surface state of a nitride semiconductor wafer and adhesion to a support substrate part to be described later. If a total thickness of the p-side electrode layer is to be changed, the thickness of the Au layer sandwiched between two Pt layers may be adjusted, for example. In order to adjust adhesion to a bonding member that connects to the support substrate, the thickness of the uppermost Au layer may be adjusted, for example.

Next, an n-side electrode 204 is formed on the sidewalls and bottoms of the outer periphery frame partitioning groove 222 and rectangle part partitioning groove 223 and on the outer periphery frame 221. The n-side electrode 204 formed on the outer periphery frame 221 is represented as an n-side electrode exposing portion 208 in FIG. 1E. For example, the n-side electrode 204 is made of material which reflects 60% or more of light that is emitted from the optical emission layer 202 and is perpendicularly incident upon the n-side electrode 204.

A resist, which has openings corresponding to the pattern of n-side electrodes 204 to be formed on the outer periphery frames 221, outer periphery frame partitioning grooves 222 and rectangle part partitioning grooves 223, is formed by photolithography. Next, aluminum (Al)/Rh/Ti/Pt/Au/Pt/Au is deposited by electron beam deposition at a thickness of 3 nm/100 nm/100 nm/100 nm/100 nm/100 nm/200 nm, for example. Thereafter, the deposited material on the surface other than the openings is removed by lift-off to form the n-side electrodes 204. Good ohmic contact can be formed even if Pt, Ir, Pd or the like is used as the second layer material.

The electrode materials of the first and second layers can have a sufficient ohmic contact without alloying. It is therefore possible to prevent a lowered reflectivity which may occur due to alloying. However, since the reflectivities of materials of the first and second layers are high and reflectivities after alloying are lowered very little, alloying may be performed if the design requirements so permit.

Similar to the p-side ohmic electrode, the fourth layer and succeeding layers of /Pt/Au/Pt/Au may be adjusted in thickness. The n-side electrode exposing portion 208 is preferably formed to the same height as that of the p-side electrode 205 by considering adhesion to the support substrate part to be described later.

Lastly, a translucent insulating member is filled in the electrode separation groove. First, a silicon oxide ($SiO_2$) film is deposited on the whole substrate surface to a thickness of about 500 to about 1000 nm, e.g., 700 nm by RF sputtering in an $N_2$ atmosphere containing, for example, $O_2$ 1%. Plasma CVD or thermal CVD may be used for depositing the silicon oxide film. Thereafter, a resist is formed by photolithography, having openings corresponding to the n-side electrode exposing portion 208 on the outer periphery frame 221 and to the p-side electrodes 205. Then, the $SiO_2$ film in the openings is removed by wet etching. The resist is washed and removed, so that the translucent insulating member 207 is embedded in the electrode separation grooves 225.

Ti may be additionally vapor-deposited on the uppermost surface layers of the p-side electrode 205 and n-side electrode 204 to a thickness of about 1 to about 3 nm. With the Ti layer coating, adhesion of the electrodes to the translucent insulating member 207 of $SiO_2$ can be improved. In this case, the Ti layer may be etched during the $SiO_2$ film etching process, thereby exposing the Au layer on the bottom of the $SiO_2$ opening.

The translucent insulating member 207 may be made of not only silicon oxide ($SiO_2$), but also titanium oxide ($TiO_2$), zirconium oxide (ZrO) or chromium oxide ($Cr_2O_3$), or any combination thereof. It is preferable to use a material having a refractive index that is the same as or close to the refractive index of the nitride semiconductor layer 198 because then the insulating member 207 does not reflect light emitted from the optical emission layer. If a refractive index difference between the translucent insulating member 207 and nitride semiconductor layer 198 is about 1.1 or smaller, light emitted from the optical emission layer 202 transmits efficiently through the electrode separation groove 225 filled with the translucent insulating member 207. Therefore, it is preferable to use such a material in the translucent insulating member 207.

The nitride semiconductor wafer that went through the above-described processes is ground and polished to a thickness to about 100 µm. Thereafter, scribing, groove formation and breaking are performed to separate the wafer into a plurality of optical emission parts.

The scribe groove is formed on the sapphire substrate 200 side in correspondence with the contour grooves 220. A knife edge of a breaking apparatus is pushed against the contour groove 220 formed on the nitride semiconductor layer 198 to separate the wafer into multiple optical emission parts. In this case, if the width of the contour groove 220 is designed slightly wider than the width of the knife edge, the scribe line and the tip of the knife edge can be made coincident with each other so that proper cleavage can be performed.

Figure 1F:
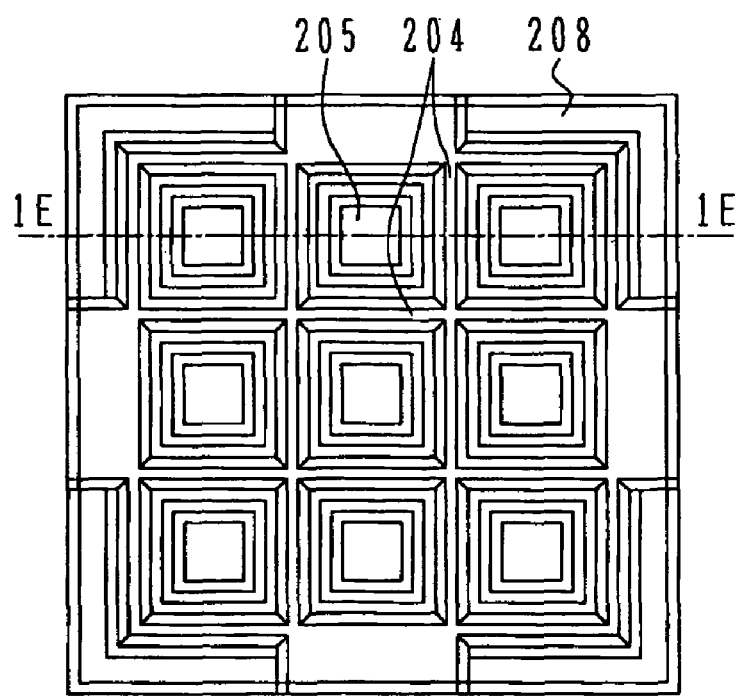

FIG. 1F is a schematic plan view of the finished optical emission part. The cross sectional view of FIG. 1E is taken along the line 1E-1E shown in FIG. 1F.

Figure 1G:
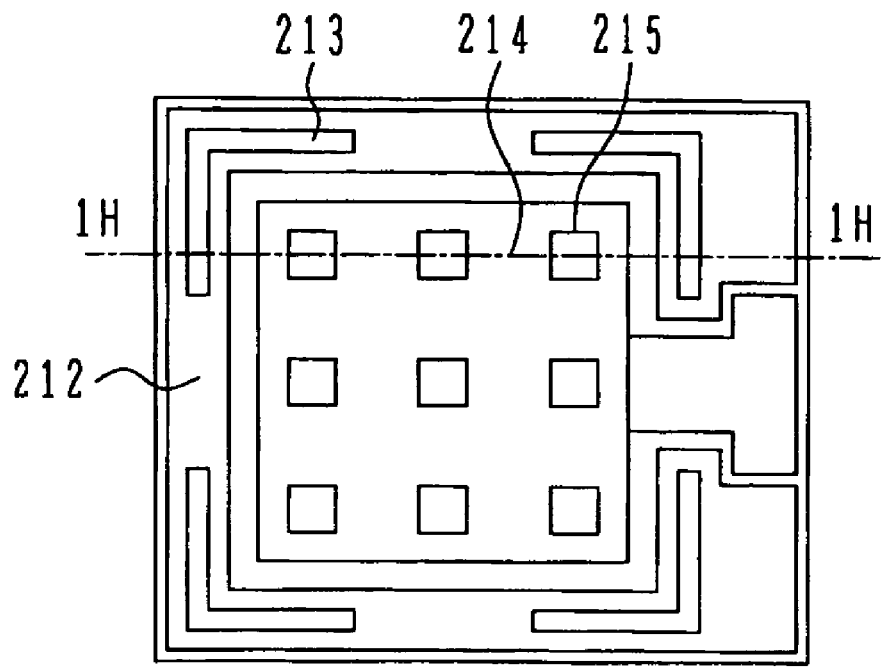

After the optical emission part is completed, a support substrate part (sub-mount part) is formed. FIG. 1G is a schematic plan view of the support substrate part.

On an insulating film formed on a support substrate of, e.g., a single crystal substrate or a polysilicon substrate, n-side lead electrode layer 212 and p-side lead electrode layer 214 are formed. An n-side bonding member 213 is formed on the n-side lead electrode layer 212. A p-side bonding member 215 is formed on the p-side lead electrode layer 214.

The n-side bonding member 213 is formed at a position and in a shape corresponding to those of the n-side electrode portion 208 in order for the n-side bonding member 213 to be connected to the n-side electrode exposing portion 208 on the outer periphery frame 221 of the optical emission part at a later process. The p-side bonding member 215 is formed at a position and in a shape corresponding to those of the p-side electrode 205 in order for the p-side bonding member 215 to be connected to the p-side electrode 205 of the optical emission part at the later process.

Figure 1H:
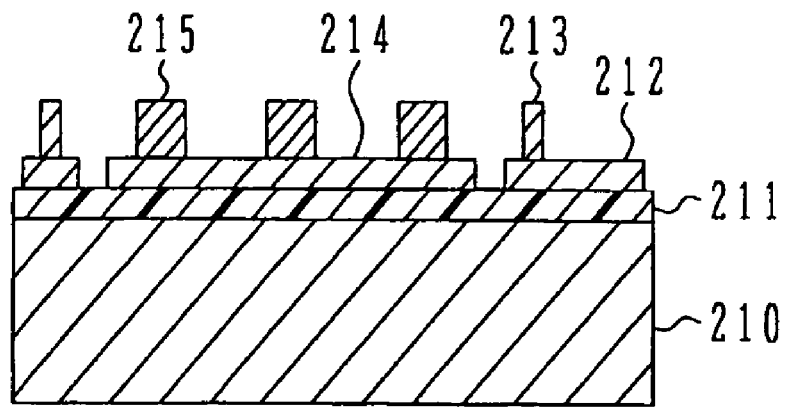

FIG. 1H is a schematic cross sectional view taken along the line 1H-1H shown in FIG. 1G. A process of forming the support substrate part will be described with reference to FIG. 1H. First, the support substrate 210 of a single crystal or polysilicon substrate is washed to clean the surface thereof, and an $SiO_2$ film having a thickness of, e.g., 300 nm as an insulating film 211 is deposited on the substrate whole surface by sputtering, for example.

This insulating film forming process can be omitted if a silicon substrate with an $SiO_2$ film is used as the support substrate 210. The insulating film forming process is also unnecessary if an insulating substrate of AlN or alumina is used as the support substrate 210.

Next, a resist is formed having openings corresponding to the pattern of the p-side lead electrode layer 214 and n-side lead electrode layer 212, by photolithography. Thereafter, Ti/Au is formed at a thickness of 10 nm/1000 nm by electron beam deposition, for example. Lastly, the electrode material on the surface other than resist openings is removed by lift-off to form the p-side lead electrode layer 214 and n-side lead electrode layer 212.

The p-side lead electrode layer 214 and n-side lead electrode layer 212 may be made of not only Ti/Au, but also a layer structure of Ni/Au, Ti/Ag, Ni/Ag, Ti/Cu/Ag, Ni/Cu/Ag or the like.

After the insulating film and the lead electrode layers are formed, a bonding member containing eutectic material is formed by the following processes.

A resist is formed having openings corresponding to the pattern of the n-side and p-side bonding members 213 and 215, by photolithography. Thereafter, Ni/Au/Pt/$(Au/Sn)_n$/Au is deposited at a thickness of 10 nm/100 nm/100 nm/(50 nm to 200 nm/50 nm to 200 nm)$_n$/50 nm to 200 nm, by electron beam deposition, for example.

The layer structures of the bonding members 213 and 215 are determined by considering an eutectic temperature and an eutectic process. Notation of "$(Au/Sn)_n$," means repetitively forming an Au layer and an Sn layer n times. For example, the Au layer having a thickness of 75.6 nm and the Sn layer having a thickness of 109.3 are repetitively formed five times.

When Au and Sn are laminated, a ratio of Sn is preferably increased as the lamination number increases. In such a case, since the melting temperature of the bonding member on the surface side lowers, adhesion to the electrode pads formed on the optical emission part can be improved. Although the AuSn alloy layer may be formed by using eutectic metal as deposition source, an $(Au/Sn)_n$/Au lamination structure provides more stable eutectic adhesion.

Lastly, material on the surface other than the resist openings is removed to leave the n-side bonding members 213 and p-side bonding members 215.

The support substrate 210 formed with the lead electrode layers 212 and 214 and bonding members 213 and 215 is thinned to about 100 µm by grinding and polishing the surface that is not formed with the electrodes. Thereafter, the support substrate, which includes a plurality of parts that will correspond to optical emission parts, is separated into a plurality of support substrate parts (sub-mount parts) by scribing, groove forming and breaking processes.

The semiconductor light emitting device (flip-chip), which will be completed after the next bonding process, is eventually mounted to a frame, a wiring substrate, a heat sink, a stem or the like in practical use. The adhesive that can be used for mounting the flip-chip device to such a component includes an Ag paste, solder, hard solder such as Au/Sn eutectic, or the like. When the support substrate 210 is ground and polished, it is preferable to adjust the roughness of the ground surface of the support substrate 210 in accordance with adhesive in order to realize good adhesion.

For example, if an Ag paste is used for mounting, good adhesion can be obtained if the grinding/polishing surface of the support substrate 210 is more or less rough. If a solder or eutectic material is used for mounting, the grinding/polishing surface is preferably a mirror surface because a Cu, Ag, Au or Sn layer is formed on the substrate surface.

Description will be made on a process of manufacturing a semiconductor light emitting device by bonding the completed optical emission part to the completed support substrate part (sub-mount part).

Figure 1I:
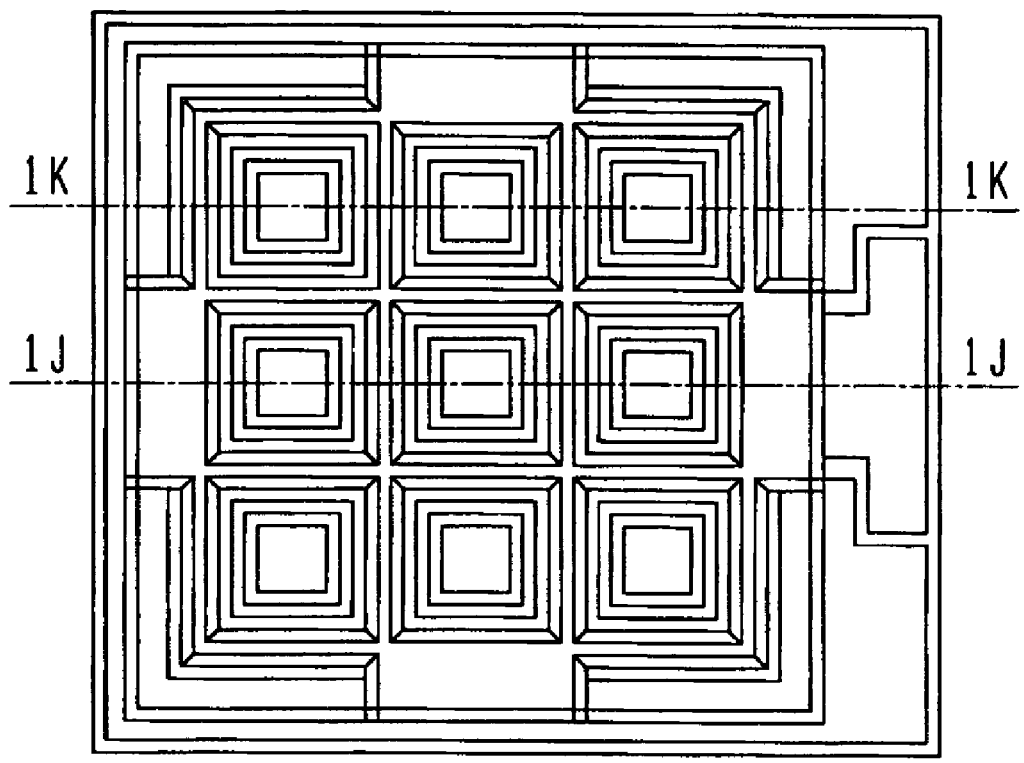

FIG. 1I is a schematic plan view of a semiconductor light emitting device manufactured by bonding the optical emission part to the support substrate part. FIG. 1I indicates a positional alignment between the optical emission part shown in FIG. 1F and the support substrate part shown in FIG. 1G. As seen from the cross sectional views of FIGS. 1J and 1K, the optical emission part shown in FIG. 1F is bonded to the support substrate part shown in FIG. 1G, with the transparent substrate 200 facing upward (front side in FIG. 1I).

Figure 1J:
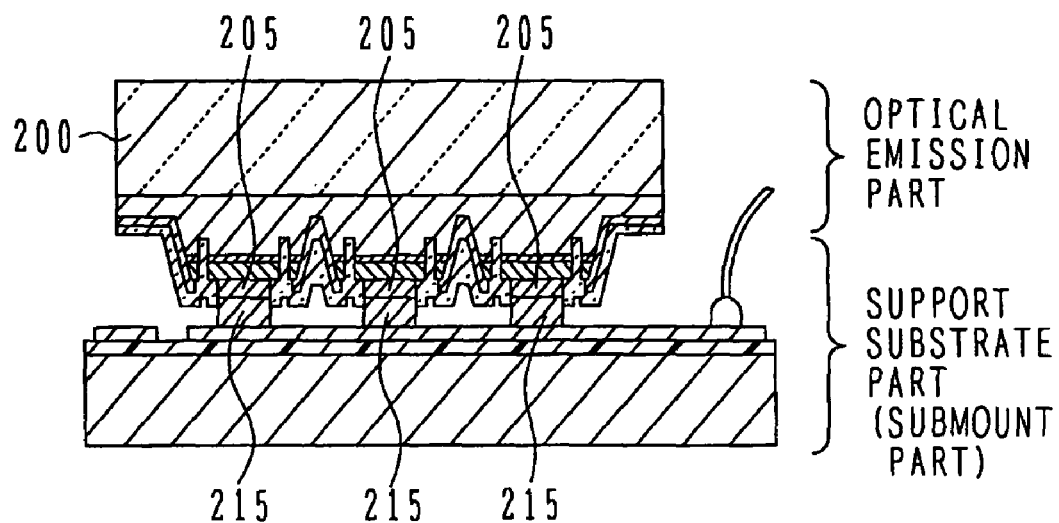
Figure 1K:
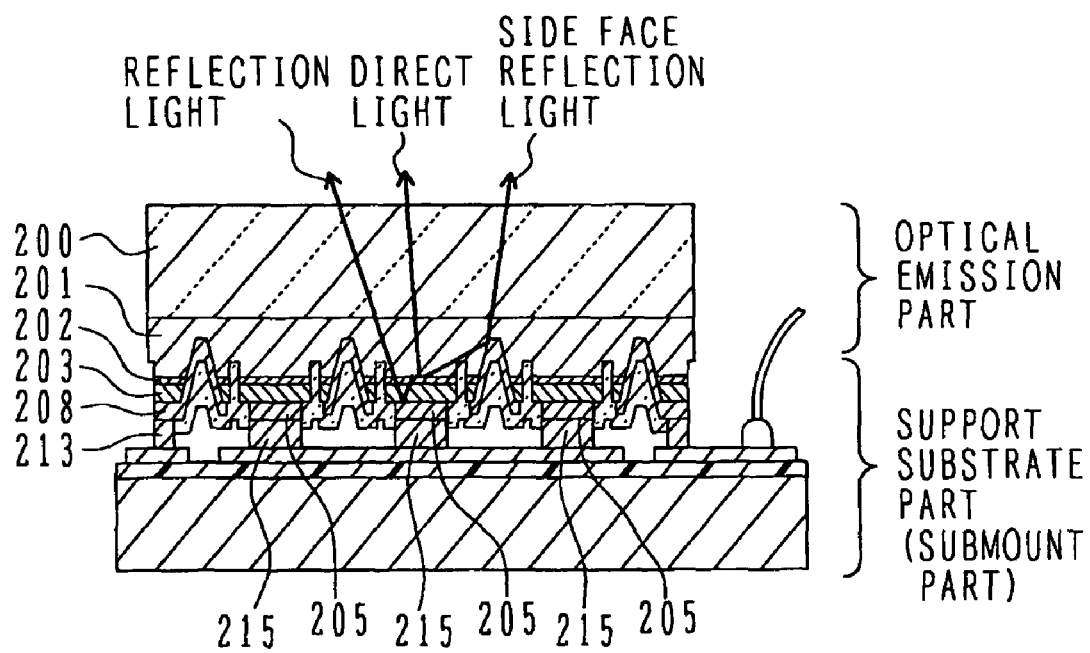

FIGS. 1J and 1K are schematic cross sectional views taken along the lines 1J-1J and 1K-1K shown in FIG. 1H, respectively.

Reference is made to FIG. 1J. The optical emission part and the support substrate part are adhered (bonded) together such that the p-side electrodes 205 of the optical emission part are aligned with the corresponding p-side bonding members 215 of the support substrate part.

As shown in FIG. 1K, the optical emission part and support substrate part are adhered (bonded) together such that the p-side electrodes 205 of the optical emission part are aligned with the corresponding p-side bonding members 215 of the support substrate part, and that the n-side electrodes 208 of the optical emission part are aligned with the corresponding n-side bonding members 213 of the support substrate part.

An eutectic bonding apparatus is used for bonding the optical emission part to the support substrate part. The electrode patterns of the optical emission part and the support substrate part are positionally aligned and pressed at a pressure suitable for eutectic, and thereafter heating, maintaining and cooling are performed at a proper eutectic temperature profile to bond the parts together. If an average eutectic composition of the bonding member is, for example, Au/20 Sn (wt %) (composition of Au mixed with 20 wt % of Sn), bonding is performed at an eutectic temperature of 280° C. to 330° C.

The semiconductor light emitting device shown in FIG. 1K has a structure (flip-chip) in which light emitted from the optical emission layer 202 is output from the transparent substrate 200 side. As will be later detailed, for example, light from the optical emission layer 202 may transmit directly through the transparent substrate 200 to an exterior (direct light), or the light may be reflected at the interface between the p-type nitride semiconductor layer 203 and p-side electrode 205, and thereafter transmit through the transparent substrate 200 (reflection light). The light may also be reflected by the n-side electrode 204 or the like formed on the partitioning groove, and thereafter transmit through the transparent substrate 200 to be output to an exterior (side face reflection light).

In bonding the optical emission part and the support substrate part, it is desired that the bonding surfaces of both the parts are abutted flush and pressed at a uniform pressure. If the bonding surfaces are pressed at a non-uniform pressure, there may occur a case in which any one of nine optical emission regions (optical emission regions separated by the translucent insulating member 207 and defined in correspondence with the p-side electrodes 205) is not properly bonded. Also, with the non-uniform pressure, even if all optical emission regions are bonded, some regions may have insufficient bonding and emission defects may occur during actual operation.

As described above, the outer periphery frame 221 (FIGS. 1C and 1D) is disposed at the four corners of the optical emission part. The outer periphery frames provide for electric connection to the n-side electrode and at the same time function to dispose the optical emission part flush with the support substrate part and to make uniform the pressures applied to the nine optical emission regions during the pressing/bonding process. By providing the outer periphery frames, the bonding yield can be improved and emission defects during the operation can be reduced considerably.

Although the bonding members are formed on the support substrate in the above-described embodiment, the bonding members may alternatively be formed on the optical emission part. Further, the bonding members may be formed on both optical emission part and support substrate part.

Further, instead of bonding the optical emission part to a support substrate part in forming a semiconductor light emitting device, the optical emission part may be bonded directly to a frame, a stem, a wiring substrate, a heat sink or the like to use it in this state without a support substrate part.

In the manufacture method described with reference to FIGS. 1A to 1K, the optical emission part and the support substrate part are cut out from the respective wafers first and are bonded as chips. Alternatively, before cutting out, the wafers may be bonded together and then diced to separate into multiple chips. Other various modifications and variations are also possible.

FIG. 2 is a schematic cross sectional view of a semiconductor light emitting device according to a second embodiment.

The second embodiment differs from the first embodiment in that although the semiconductor light emitting device of the first embodiment has nine optical emission regions, the semiconductor light emitting device of the second embodiment has only one optical emission region. Further, the semiconductor light emitting device of the second embodiment has no portion corresponding to the outer periphery frames of the semiconductor light emitting device of the first embodiment, and a portion corresponding to the n-side electrode exposing portion is formed on a sapphire substrate 200.

A manufacture method for the semiconductor light emitting device of the second embodiment is similar to the manufacture method for the semiconductor light emitting device of the first embodiment. Differences reside in the formation of grooves. Instead of the process of forming grooves described with reference to FIG. 1D above, an electrode separation groove 225 is formed and then a structure is formed which has an inclined end face (side end face) of a nitride semiconductor layer 198 (which includes a p-type nitride semiconductor layer, an optical emission layer and an n-type nitride semiconductor layer). This structure is formed, for example, by following processes.

First, a resist is formed having an opening corresponding to the electrode separation groove 225 by photolithography. Next, a p-type nitride semiconductor layer and an optical emission layer and a partial surface layer of an n-type nitride semiconductor layer in the opening are dry-etched and removed. Thereafter, the resist is washed and removed to thereby form the electrode separation groove 225 having a depth exposing the n-type nitride semiconductor layer.

Next, a resist is formed having an opening corresponding to an inclined portion on the device end face (side face) by photolithography. The side wall of the opening has an inclined face. The nitride semiconductor layer 198 is etched and removed until the sapphire substrate 200 is exposed to form an inclined end face (side end face).

The manufacture method for the semiconductor light emitting device of the second embodiment differs from the manufacture method for the semiconductor light emitting device of the first embodiment also in the following point. As described above, the semiconductor light emitting device of the second embodiment has no corresponding portion to the outer periphery frames of the first embodiment, and a portion corresponding to the n-side electrode exposing portion is formed on the sapphire substrate 200.

Therefore, in the process of forming the support substrate part described with reference to FIG. 1G, a p-side bonding member 215 and an n-side bonding member 213 are formed separately to such heights that the p-side bonding member 215 becomes in tight contact with the p-side electrode 205 and that the n-side bonding member 213 becomes in tight contact with the n-side electrode 204, respectively in the bonding process of the optical emission part with the support substrate part.

FIG. 3 is a schematic cross sectional view illustrating some of the characteristic portions common to the semiconductor light emitting devices of the first and second embodiments.

In the semiconductor light emitting devices of the first and second embodiments, light propagating (guided) in the nitride semiconductor layer 198 transmits through the electrode separation groove 225 filled with the translucent insulating member 207, and is reflected at the n-side electrode 204 formed on the optical emission region end face (including a device end face) towards the substrate 200 side. With reference to FIG. 3, the details and effects of this structure will be described.

In the semiconductor light emitting devices of the first and second embodiments, the electrode separation groove 225 is formed at lateral end portions of a region that actually emits light. The electrode separation groove penetrates the p-type nitride semiconductor layer 203 and optical emission layer 202, and reaches the n-type nitride semiconductor layer 201. The electrode separation groove 225 is filled with the translucent insulating member 207.

With the electrode separation groove 225, the region on the p-side electrode 205 side and the region on the n-side electrode 204 side can be electrically separated. By filling the electrode separation groove 225 with the translucent insulating member 207, light propagating (guided) in the nitride semiconductor layer 198 can propagate also in the translucent insulating member without much disturbance. Therefore, with this structure, light can be guided more towards a reflection electrode (n-side electrode 204) at the end face (side end face).

It is preferable to form the electrode separation groove 225 in the n-type nitride semiconductor layer 201 as shallow as possible so long as the region on the p-side electrode 205 side and the region on the n-side electrode 204 side can be electrically separated. This is because light propagating (guided) in the n-type nitride semiconductor layer 201 should be less disturbed. The width of the electrode separation groove 225 is preferably as narrow as possible in this regard so long as the translucent insulating member 207 can fill the groove.

The electrode separation groove 225 is required to have such a depth that the p-type nitride semiconductor layer 203 and optical emission layer 202 are electrically separated between the optical emission region side and the region outside the optical emission region separated by the electrode separation groove 225. This electric separation must be such that it allows efficient injection of holes from the p-side electrode 205 and electrons from n-side electrode 204 into the optical emission layer 202 through the p-type nitride semiconductor layer 203 and n-type nitride semiconductor layer 201, respectively. According to the researches conducted by the present inventors, it has been found that the desired electric separation can be realized if the n-type semiconductor layer 201 is removed to a depth of about 0.1 to about 0.3 µm from a border between the optical emission layer 202 and the n-type nitride semiconductor layer 201, when reactive ion etching (RIE) is used for etching the n-type nitride semiconductor layer.

The present inventors manufactured the semiconductor light emitting devices of the first and second embodiments and encountered no etching problem when using an etching process having a depth resolution of 0.1 µm, with the target etching depth of about 1.5 µm or shallower in the formation of the electrode separation grooves 225 when the total thickness of the p-type nitride semiconductor layer 203 and optical emission layer 202 was about 1.2 µm or less.

The width of the electrode separation groove 225 should be such that the electrode separation groove 225 can be filled with the translucent insulating member 207, and in addition must be larger than the minimum pattern width that can be realized by the resist pattern formed by photolithography. The photolithography used in manufacturing the above-mentioned working examples was capable of forming the pattern width of about 1 µm to 1.5 µm or wider. In this case, when considering the yield, it is preferable to set the width of the groove to about 2 µm to about 3 µm when the required depth is about 0.5 µm.

Next, the translucent insulating member 207 will be described in more detail. As the electrode separation groove 225 is filled with the translucent insulating member 207, it becomes possible to prevent light propagating (being guided) in semiconductor crystal from being reflected at the wall of the electrode separation groove 225 and prevent transmission light from being output to the outside of the electrode separation groove 225 by refraction. In order to suppress reflection and refraction, oxide material is selected such that it has a refractive index equal to or close to that of nitride semiconductor crystal.

In the following, a brief description will be made on the reason why a transmissivity in the electrode separation groove can be prevented from being lowered, by filling the electrode separation groove 225 with the translucent insulating member 207 having a refractive index equal to or close to that of the nitride semiconductor layer 198.

When light becomes incident from one medium (first medium) upon another medium (second medium), a portion of light is reflected and returned to the first medium and a remaining portion is transmitted and enters the second medium. Light other than perpendicular incident light is refracted and changes its optical path.

A reflectivity can be calculated from the Fresnel formula which treats light as having two components: a perpendicular electric field (P wave) and a perpendicular magnetic field (S wave) relative to an interface between the first and second mediums.

If perpendicular incidence only is considered, a reflectivity of perpendicular electric field light is equal to a reflectivity of perpendicular magnetic field light, and the reflectivity is given by the following formula (1):

$$R_E = R_H = \left| \frac{1 - n2/n1}{1 + n2/n2} \right|^2 \tag{1}$$

where $R_E$ is a reflectivity of a perpendicular electric field, $R_H$ is a reflectivity of a perpendicular magnetic field, n1 is a refractive index of the first medium and n2 is a refractive index of the second medium.

A refractive index of nitride semiconductor crystal (first medium) is 2.5. If the translucent insulating member 207 is not embedded, the second medium is air (refractive index is 1.0). The refractive indices of silicon oxide and titanium oxide are 1.5 and 2.5, respectively. Therefore, in cases where the translucent insulating member 207 is not provided, silicon oxide is used as the translucent insulating member 207, and titanium oxide is used as the translucent insulating member 207, respectively, propagation light (guided light) is reflected at the interface at a rate of 18.4%, 6.3%, and 0%, respectively.

According to the calculations performed by the present inventors, in the above-described three cases, when light is perpendicularly incident upon a side surface of the groove and emerges from the opposite side surface of the groove, the intensity of the emerging light is 66.6%, 87.9% and 100%, respectively, of that of the incident light (66.6%=82.6%$^2$, 87.6%=93.6%$^2$, and 100%=100%$^2$, as a result of passing through the semiconductor/translucent member interface twice). It is therefore possible to efficiently transmit light through the groove by filling the electrode separation groove 225 with the translucent insulating member 207 having a refractive index equal to or close to that of the nitride semiconductor layer 198. If the electrode separation groove 225 is filled with a material having a refractive index of 1.4 or higher, the above-mentioned intensity ratio (the intensity of light that has laterally passed through the groove relative to the incident light) is about 85% or higher (85%=92%$^2$). It is therefore preferable to fill the groove with a material having a refractive index having a difference of 1.1 or smaller from the refractive index of the nitride semiconductor layer 198.

Materials suitable for the translucent insulating member 207 include chromium oxide, zirconium oxide and the like as well as titanium oxide and silicon oxide. Films of these materials can be easily formed by oxygen assist sputtering, for example.

Filling the groove with the translucent insulating member 207 has also the effect of protecting an interface between the p-type nitride semiconductor layer 203 and optical emission layer 202 and an interface between the n-type nitride semiconductor layer 201 and optical emission layer 202. Providing the translucent insulating member 207 can prevent stain and dust from entering the groove and being attached to it during the eutectic bonding process, packaging process and other subsequent fabrication processes. Therefore, the translucent insulating member also contributes to improvement of the yield.

The translucent insulating member can also prevent electrode material from attaching to the wall of the groove, which may occur by electromigration of the electrode material as a result of a long term use of the semiconductor light emitting device and/or by electrochemical migration induced by moisture. It is therefore possible to prevent degradation of the semiconductor light emitting device. In a finished product using the light emitting device as its component, the wall of the electrode separation groove 225 can be protected from foreign objects, such as gas and metal particles emitted from other components.

Next, description will be made on the detailed structure and effect of the n-side electrode 204 (end face reflection electrode). The n-side electrode 204 is disposed to cover substantially the entire side of nitride semiconductor layer 198 (p-type nitride semiconductor layer 203, optical emission layer 202 and n-type nitride semiconductor layer 201), which is electrically insulated from the side of the p-side electrode 205 (optical emission region side) by the electrode separation groove 225. For example, it is disposed on the entire inclined surface formed from the upper portion of the p-type nitride semiconductor layer 203 to the lower portion of the n-type nitride semiconductor layer 201. The angle of the reflection surface of the n-side electrode 204 (an inclined surface of the nitride semiconductor layer 198) is preferably about 35° to about 50° relative to the surface of the substrate 200, and more preferably, about 40° to about 45°, when the effective incident angle of a propagation (guided) light is about ±40°. By forming the reflection surface at this angle, light incident upon the n-side electrode 204 can be effectively reflected toward the substrate 200 side irrespective of the angle of incident light.

Since the n-side electrode 204 is formed on the p-type nitride semiconductor layer 203 and optical emission layer 202, which are electrically insulated from the optical emission region by the electrode separation groove 225, there occurs no problem of electric short or the like.

The p-type nitride semiconductor layer 203 and optical emission layer 202, which are isolated in this region (where the n-side electrode 204 is formed; i.e., outside the optical emission region) by the electrode separation groove 225 filled with the translucent insulating member 207, provides a propagation path (guided path) of light from the nitride semiconductor layer 198 on the side of the p-side electrode 205 (on the side of the optical emission region), together with the n-type nitride semiconductor layer 201. Therefore, light propagating (guided) from the nitride semiconductor layer 198 in the optical emission region to the device end face side becomes incident upon the n-side electrode 204 through the translucent insulating member 207, or without going through the translucent insulating member. The incident light is reflected effectively toward the substrate 200 side. Thus, the presence of the translucent insulating member 207 increases the amount of light incident upon the n-side electrode 204 and therefore increases the amount of light reflected toward the substrate 200 side and output to the exterior from the substrate 200 side.

For example, in a semiconductor light emitting device having a structure in which the n-side electrode 204 is disposed only on the n-type nitride semiconductor layer 201, it is difficult to reflect light emitted from the end face of the p-type nitride semiconductor layer 203 and optical emission layer 202 and to guide propagation light (guided light) toward the substrate 200 side. However, in the semiconductor light emitting devices of the first and second embodiments, this difficulty is obviated because the n-side electrode 204 is disposed in a region including the inclined surface formed by the side edges of the p-type nitride semiconductor layer 203, optical emission layer 202 and n-type nitride semiconductor layer 201.

As described above, a significant amount of light emitted from the optical emission layer 202 propagates (is guided) in the nitride semiconductor layer 198. The semiconductor light emitting devices of the first and second embodiments are provided with features capable of guiding the propagation (guided) light to the end face (side end face) of the nitride semiconductor layer 198 (e.g., the structure filling the electrode separation groove 255 with the translucent insulating member 207 and the structure that the reflection electrode that can reflect a wide range of incident light is formed on the entire end face or substantially entire end face of the nitride semiconductor layer 198). Therefore the light emitting device according to the first and second embodiments of the present invention has an excellent light extraction efficiency.

It has been found from additional extensive researches by the present inventors that depending on the device structures and dimensions, the reflection surface (n-side electrode 204) may not have to cover the entire side end surfaces formed from the p-type nitride semiconductor layer 203 towards substrate 200, but a certain length of the side end face of the n-type nitride semiconductor layer 201 adjacent to the substrate 200 may be left without the reflection surface. A change in the output of the semiconductor light emitting device was not observed when the reflection surface was not provided at a region of the side end face of the n-type nitride semiconductor layer 201 that was about 1 µm to about 3 µm in thickness adjacent to the substrate 200, when the thickness of the layer 201 was about 6 µm to about 12 µm. The same was true when the region where the reflection surface was not provided was about 1 µm to about 1.5 µm in thickness when the thickness of the layer 201 was about 3 µm to about 6 µm. Therefore, when considering the etching time required to form the inclined surface, advantages may often be obtained if a portion of the n-type nitride semiconductor layer 201 towards its bottom is not formed with the inclined surface.

Figure 4:
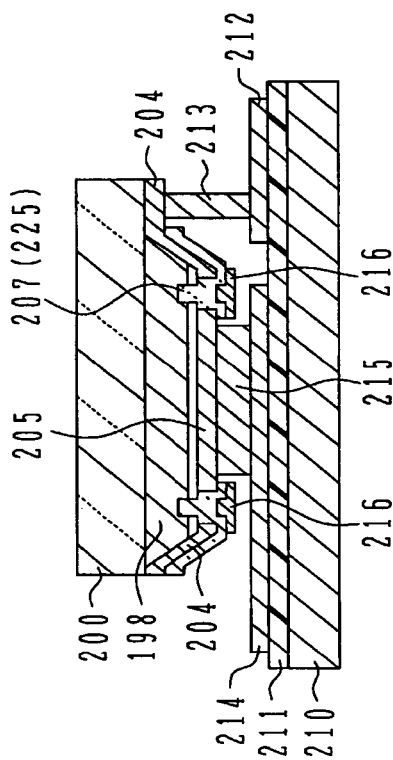
FIG. 4 is a schematic cross sectional view showing a semiconductor light emitting device according to a third embodiment.

FIG. 4 is a schematic cross sectional view of a semiconductor light emitting device according to a third embodiment.

The semiconductor light emitting device of the third embodiment differs from the semiconductor light emitting device of the second embodiment in that a space covering layer 216 is formed on the translucent insulating member 207. The space covering layer 216 has a function of shielding transmission/refraction light to be leaked to the exterior among the light propagating (being guided) in the nitride semiconductor layer 198, via the electrode separation groove 225 filled with the translucent insulating member 207.

The semiconductor device of the third embodiment can be manufactured by adding a process of forming the space covering layer 216 to the manufacture method for the semiconductor light emitting device of the second embodiment. The space covering layer 216 can be formed by the following processes to be executed after the process of embedding the translucent insulating member 207 described with reference to FIG. 1E.

A resist is formed on the translucent insulating member 207, having an opening in a shape of the space covering layer 216 to be positioned between the n-side electrode 204 and p-side electrode 205, by photolithography. Next, Rh is deposited to a thickness of 100 nm by electron beam deposition, and deposited material on the surface other than the mask opening is removed by lift-off to thereby form the space covering layer 216. In order to improve adhesion to the translucent insulating member 207, a Ti or Ni layer having a thickness of, e.g., 3 to 10 nm may be formed on the translucent insulating member 207 and the space covering layer 216 is formed on the Ti or Ni layer.

The material of the space covering layer 216 is not limited to Rh, but a material having a high reflectivity relative to light emitted from the optical emission layer 202, such as Pt and Pd, may also be used preferably. Among metallic materials, it is desirable to use stable metal that does not cause electromigration and electrochemical migration. Electromigration will not occur unless there is electric connection. However, since the space covering layer 216 is disposed at a position where there is a possibility that bonding material such as Au/Sn flows out and forms electric connection, it is preferable to use stable metal material that does not cause electromigration. The space covering layer 216 can prevent, for example, radiation light from leaking into a bonding space between the optical emission part and support substrate part. For example, in an LED lamp to be described later with reference to FIG. 8B, resin called under-fill is filled in the bonding space between the optical emission part and support substrate part. Light leaked into the bonding space between the optical emission part and support substrate part has a higher optical density per unit area, although a ratio of light to the total amount of light of the device is smaller than that of light between the p- and n-side electrodes, so that resin (under-fill) is likely to be deteriorated. The space covering layer 216 contributes also to preventing such deterioration of the resin (under-fill).

As will be later described with reference to FIG. 8B, the semiconductor light emitting device of the third embodiment can hermetically seal the bonding portion of the device so that an ultra small LED lamp can be manufactured by using under-fill and side-fill.

Figure 5:
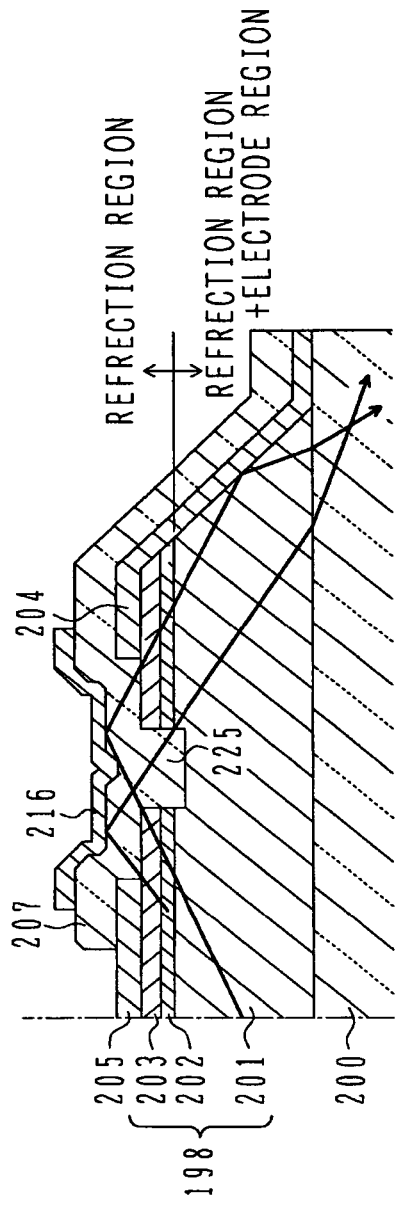
FIG. 5 is a schematic cross sectional view showing some of the characteristic portions of the semiconductor light emitting device of the third embodiment.

FIG. 5 is a schematic cross sectional view showing a portion of the semiconductor light emitting device of the third embodiment.

The semiconductor light emitting device of the third embodiment has a structure similar to the semiconductor light emitting devices of the first and second embodiments described with reference to FIG. 3, and in addition the structure that the space covering layer 216 is formed on a partial surface of the translucent insulating member 207. For example, the space covering layer 216 is made of material which reflects 60% or more of light emitted from the optical emission layer 202 and perpendicularly entered the space covering layer 216. With reference to FIG. 5, description will be made on the details and effects of this structure.

The space covering layer 216 is made of, for example, a material having a high reflectivity relative to light emitted from the optical emission layer 202, and is formed on the translucent insulating member 207 in an area overlapping a portion of the p-side electrode 205 and a portion of n-side electrode 204 and covering the underlying electrode separation groove 225.

Preferred materials for the space covering layer 216 include ceramic, metal and the like. In the case of ceramic material, it is preferable to use ceramic material having a high optical reflectivity. For example, it is preferable to use barium sulfate ($BaSO_4$) or high weather resistant alumina (($Al_2O_3$), which is used as reflection material of integrating spheres, aluminum nitride (AlN), silicon nitride (SiN), boron nitride (BN) or the like.

If the space covering layer 216 is to be made of metal material, it is preferable to use metal material which reflects light and which is hard to cause electromigration and electrochemical migration. It is desirable to use material that will not melt during the process of bonding the optical emission part to the support substrate part. By considering these conditions, the space covering layer is preferably made of platinum (Pt), rhodium (Rh), palladium (Pd), iridium (Ir) or the like. Gold (Au) may be used depending upon the wavelength of light emitted from the optical emission layer 202.

In order to enhance adhesion to the translucent insulating member 207, for example, the space covering layer 216 may have a two-layer structure. The first layer may be made of nickel (Ni), titanium (Ti), aluminum (Al) or the like. If a protective film is formed on the translucent insulating member 207, the space covering layer 216 may have a multi-layer structure having two or more layers, and the final layer may be made of Ni, Ti or Al. Although Ni, Ti and Al may cause migration, if a thickness is about 3 nm to about 30 nm, there is no problem.

Because the space covering layer 216 is formed, light traveling in the region between the p-side electrode 205 and n-side electrode 204 is reflected toward the substrate 200 side so that it is possible to prevent such stray light from transmitting through the translucent insulating member 207 and leaking to the exterior (to the upper side in FIG. 5), thereby increasing the output of the light emitting device.

Figure 6A:
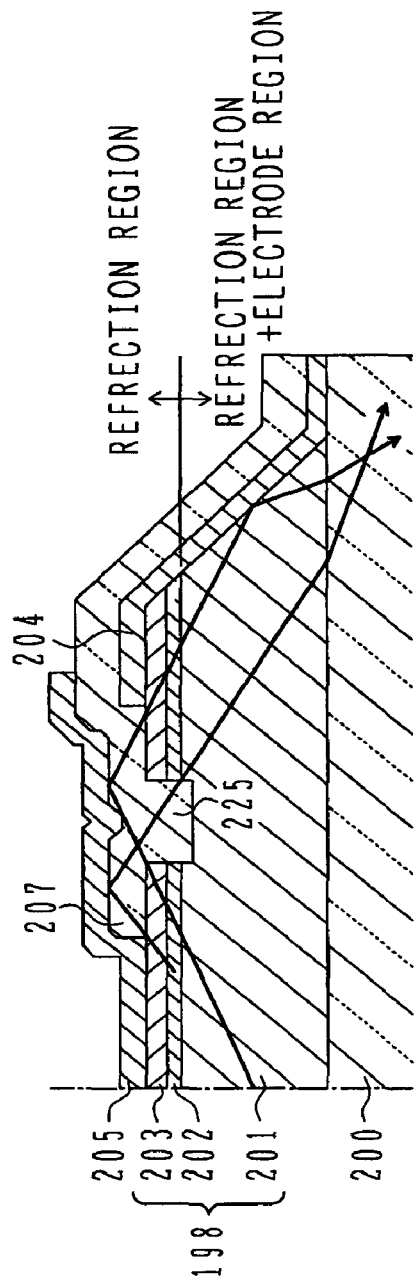
FIGS. 6A and 6B are schematic cross sectional views showing modifications of the semiconductor light emitting device of the third embodiment.
Figure 6B:
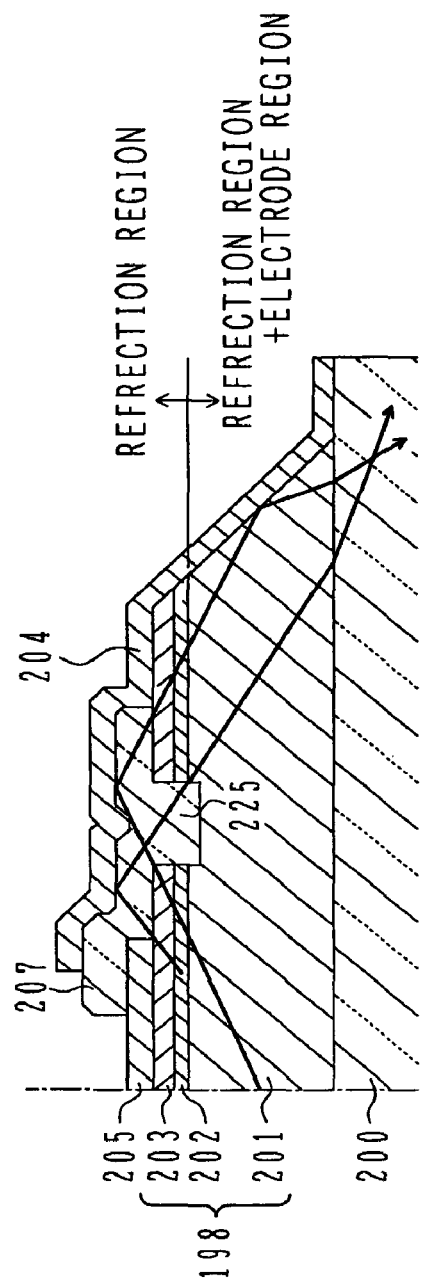

FIGS. 6A and 6B are schematic cross sectional views showing modifications of the semiconductor light emitting device of the third embodiment. In the modification shown in FIG. 6A, the p-side electrode 205 is formed also on the translucent insulating member 207 at the position above the n-side electrode 204, to provide a similar function to that of the space covering layer 216 of the third embodiment.

Reference is made to FIG. 6B. In the modification shown in FIG. 6B, the n-side electrode 204 is formed also on the translucent insulating member 207 at the position above the p-side electrode 205, to provide a similar function to that of the space covering layer 216.

The semiconductor light emitting devices having the structures shown in FIGS. 6A and 6B can be manufactured with a smaller number of processes as compared with the third embodiment, because the space covering layer 216 is not separately formed.

The present inventors manufactured the semiconductor light emitting devices of the first to third embodiments and semiconductor light emitting devices of comparative examples, and compared the characteristics of these devices.

FIG. 7 is a table showing the characteristics of the semiconductor light emitting devices of the first to third embodiment and the semiconductor light emitting devices of the comparative examples.

Figure 9A:
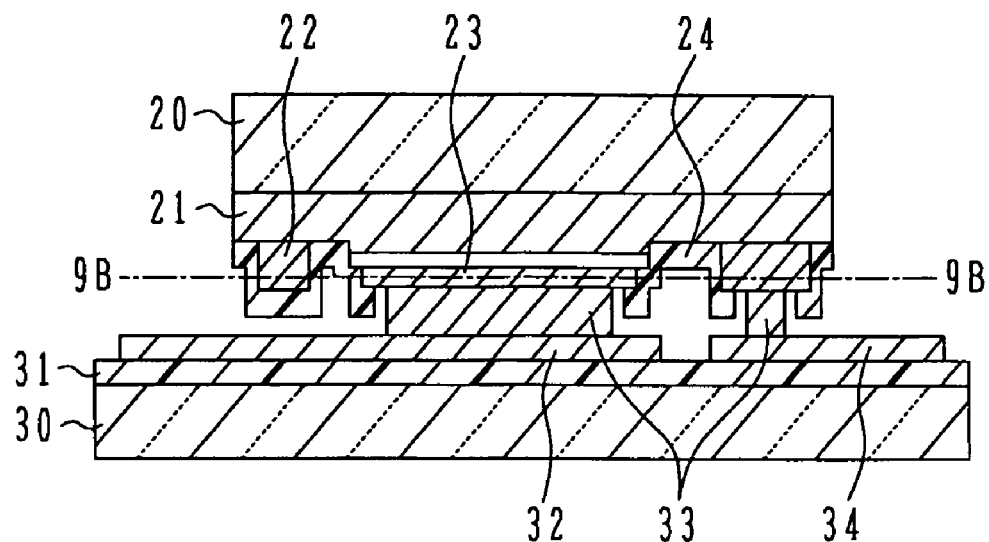
FIGS. 9A and 9B are schematic cross sectional views of an LED having a flip-chip structure.
Figure 9B:
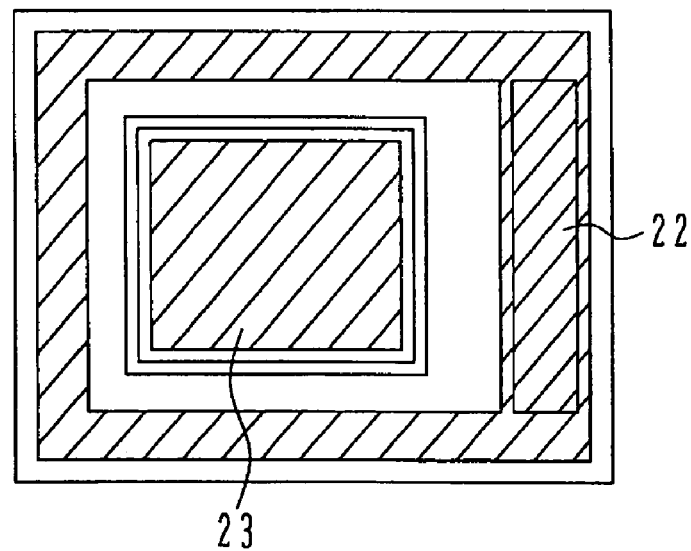
Figure 10:
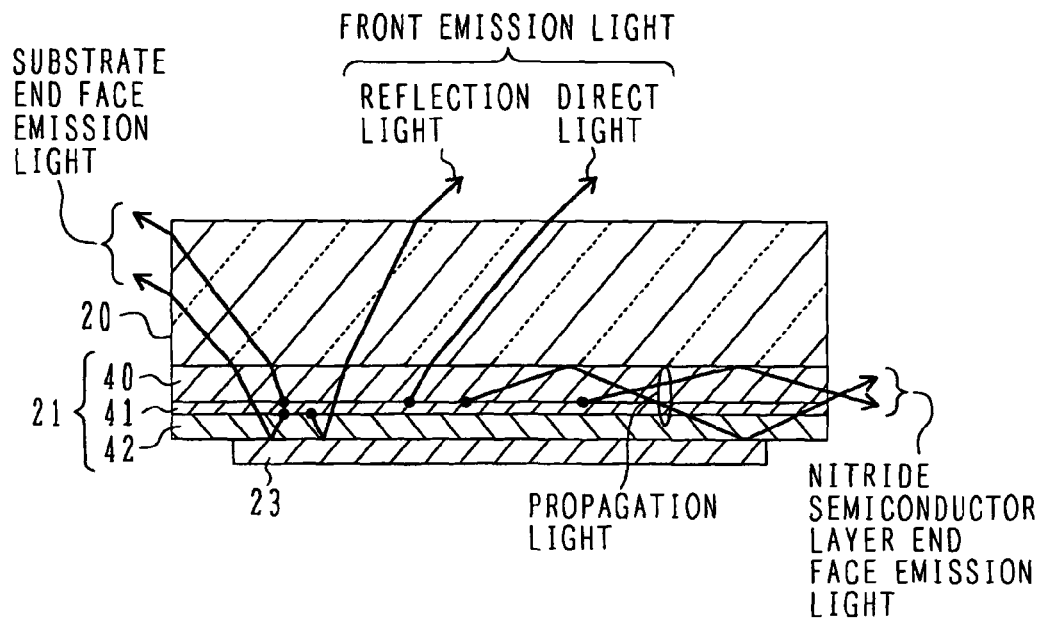
FIG. 10 shows optical output paths of light emitted from LED of the flip-chip structure shown in FIGS. 9A and 9B.
Figure 11:
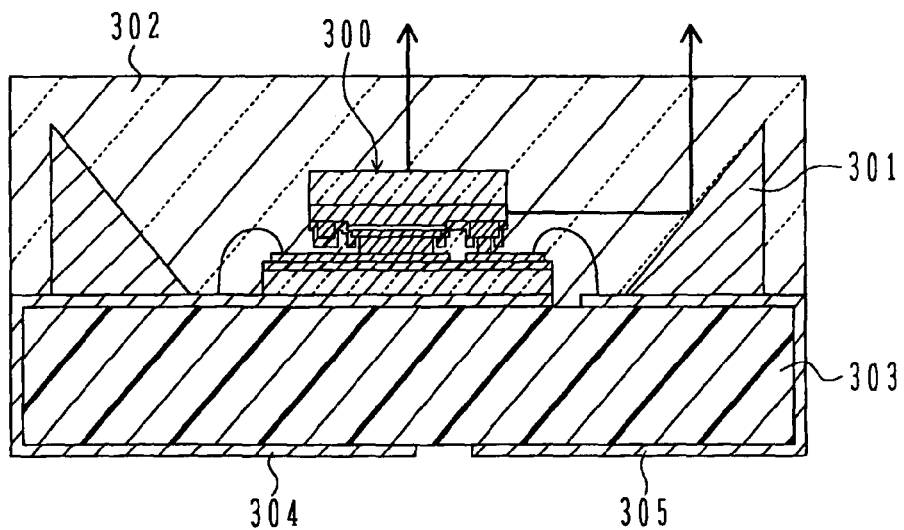
FIG. 11 is a schematic cross sectional view of an LED lamp.

"Comparative LED 1" in the table is an LED having one optical emission region with the structure shown in FIGS. 9A and 9B. A dice size was 0.3 mm×0.3 mm and current of 20 mA was caused to flow for optical emission.

The semiconductor light emitting devices of the second and third embodiments (described as "second embodiment LED" and "third embodiment LED" respectively in the table) were formed in the same dice size as that of the "comparative LED 1" and current of the same value (20 mA) was caused to flow for optical emission.

"Comparative LED 2" in the table is a device having nine optical emission regions (similar to the first embodiment in that regard) with the structure of each optical emission region shown in FIGS. 9A and 9B. A dice size was 1.0 mm×1.0 mm and current of 350 mA was caused to flow for optical emission.

The semiconductor light emitting device of the first embodiment (described as "first embodiment LED" in the table) was formed in the same dice size as that of the "comparative LED 2" and current of the same value (350 mA) was caused to flow for optical emission.

The dice size is indicated by rated values. The "comparative LED 1", "second embodiment LED" and "third embodiment LED" were manufactured so as to have the same area for optical emission. The "comparative LED 2" and "first embodiment LED" were also manufactured so as to have the same area for optical emission (i.e., the optical emission regions surrounded by the separation groove have the same area).

Reference is made to the row "total light flux". The "total light flux" indicates a total light amount (output) of LED. In this row, the values of the "second embodiment LED" and "third embodiment LED" are normalized by setting the value of the "comparative LED 1" to 100%. The value of the "first embodiment LED" is normalized by setting the value of the "comparative LED 2" to 100%.

The values of the "second embodiment LED" and "third embodiment LED" are 1.1 times the value of the "comparative LED 1". The value of the "first embodiment LED" is 1.3 times the value of the "comparative LED 2". It can be understood that there is an increase in the amounts of light outputs to the device exterior of the semiconductor light emitting devices of the first to third embodiments.

Reference is made to the row "front light flux ratio". The front light flux ratio is defined by (front light flux/total light flux) ×100 and has the unit of %. The front light flux is an amount (output) of light output from the surface of the sapphire substrate.

It was confirmed that although the front light flux ratio of the "comparative LED 1" was 55% and the front light flux ratio of the "comparative LED 2" was 65%, the front light flux ratios of the semiconductor light emitting devices of the first to third embodiments were 85%. It can be understood that there is an increase in not only the amount of light output to the device exterior but also the amount of light output from the sapphire substrate surface.

Reference is made to the row "drive voltage". Voltage (3.2 V) necessary for driving the "second embodiment LED" and "third embodiment LED" is the same as voltage (3.2 V) necessary for driving the "comparative LED 1". Namely, a high output is realized by supplying the same power amount. The "first embodiment LED" can be driven at voltage (3.2 V) lower than the drive voltage (3.3 V) necessary for driving the "comparative LED 1". It can be understood that a low power and high output can be realized.

As compared with the "comparative LED 2", the "first embodiment LED" presents an improved performance in all of the total light flux, front light flux ratio and drive voltage. The total light flux is improved by 30% and the intensity of the front light flux is improved by about 70%. From these results, it can be said that the embodiment LEDs have significantly better characteristics than the comparative examples, and the performance improvement is even better with the large current and high output type LED device of 1 mm×1 mm as compared with the regular size device of 0.3 mm×0.3 mm.

Generally, a large size device is susceptible to a large attenuation amount of propagation (guided) light. It can be considered that the improvement on the light extraction efficiency (increase in total light flux) is mainly ascribed to the structure that n-side reflection electrodes are disposed in a matrix shape to intercept optical paths of laterally propagating (guided) light so that the propagation light is output from the substrate side before being attenuated.

It can be considered that the improvement on optical distribution (the increase in front light flux ratio) is achieved at least in part because the angle of the reflection surface of the n-side reflection electrode is set to about 35° to about 50° or preferably about 40° to about 45° as measured from the substrate surface as a reference. In this structure, light can be reflected effectively toward the substrate side irrespective of an incident angle of incident light upon the n-side reflection electrode.

It can also be considered that since the n-side reflection electrodes are disposed in a matrix shape, current is diffused in the whole area of the device in-plane so that an optical emission output can be increased and the drive voltage can be suppressed lower.

Figure 8A:
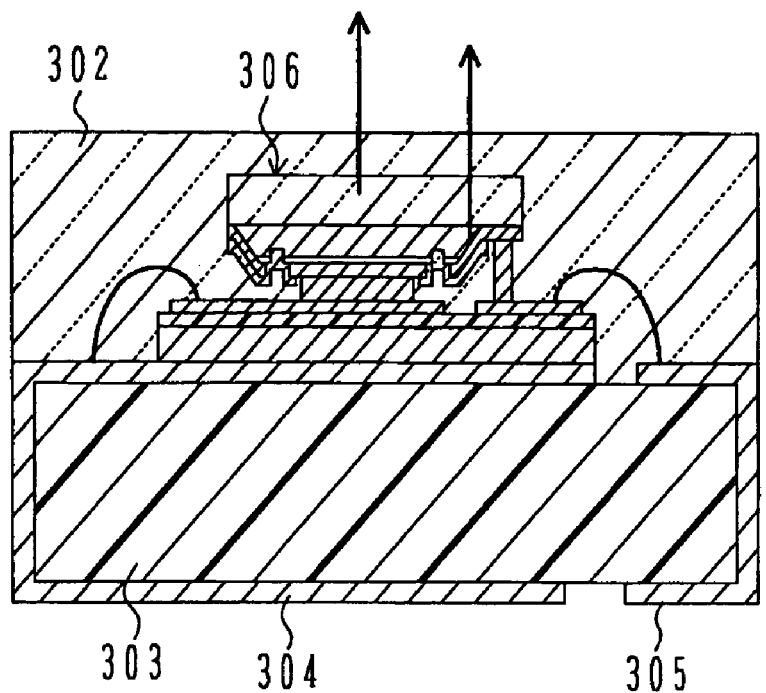
FIGS. 8A and 8B are schematic cross sectional views of LED lamps constituted of semiconductor light emitting devices of the embodiments.
Figure 8B:
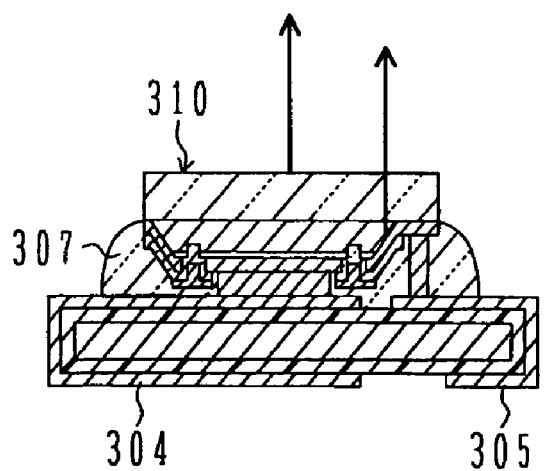

FIGS. 8A and 8B are schematic cross sectional views of LED lamps constituted of semiconductor light emitting devices of the embodiments. FIG. 8A shows an example in which an LED lamp constituted of the semiconductor light emitting device of the second embodiment is used.

A semiconductor light emitting device 306 is placed on a lamp substrate 303. P- and n-side lead electrodes of the semiconductor light emitting device 306 are connected to p- and n-side lamp lead electrodes 304 and 305, respectively, to supply a power from an external power source. The semiconductor light emitting device 306 is covered with translucent resin 302 for protection thereof.

A reflection horn is not necessarily required in the light emitting device of the embodiment, because the device adopts the structure that the n-side reflection electrode is disposed on the inclined surface formed on at least a portion of a closed lines or curves surrounding the optical emission region to reflect light emitted from the optical emission region toward the substrate side.

Reference is made to FIG. 8B. FIG. 8B shows an example in which an LED lamp constituted of the semiconductor light emitting device of the third embodiment. In the LED lamp shown in FIG. 8B, p-side and n-side lead electrodes of a semiconductor light emitting device 310 are extended to the bottom of a support substrate to be used as the extended lead electrodes as connection portions to an external circuit. Therefore, a lamp substrate is not necessary as opposed to the LED lamp shown in FIG. 8A.

The LED lamp shown in FIG. 8B does not adopt the structure that the whole semiconductor light emitting device is covered with a translucent resin, but adopts the structure that under-fill 307 covers the space between the sapphire substrate and the support substrate.

With this structure, an ultra small size LED lamp (chip size package: CSP) can be manufactured. Under-fill or side-fill has also the function of improving tight adhesion between the optical emission part and support substrate part to enhance a die shear strength and thermal conductivity.

The under-fill or side-fill will be described further. A resin having a high durability against light (translucent resin 302) can be used for the LED lamp shown in FIG. 8A. However, it is difficult to use such a high light-proof resin for the ultra small size LED lamp shown in FIG. 8B because a space between the optical emission part and the support substrate part is very narrow. In order to fill such a narrow space, a resin having a high permeability called under-fill or side-fill is used.

Generally, such under-fill or side-fill has a low durability (a low light-proof against short wavelength light (blue region to ultraviolet region) and is likely to be deteriorated if exposed to such light for a long period of time. Hermetic seal at the bonding portion is therefore likely to be weakened. However, in the semiconductor light emitting device of the third embodiment, since optical leak is prevented or minimized by the space covering layer or similar structure (e.g., 216 in FIGS. 4 and 5), it is possible to prevent deterioration of the side-fill or under-fill and retain hermetic seal for a long period. Therefore, the semiconductor light emitting device of the third embodiment or its modifications described above is suitable for use with this type of ultra small size LED lamp.

The present inventors conducted experiments in light-proof properties of under-fill to be used for LED. Three samples were used for comparison: a sample (called a comparative LED) in which a space between the optical emission part and the support substrate part of the conventional LED shown in FIGS. 9A and 9B is filled with an under-fill; a sample (called a second LED) in which a space between the optical emission part and the support substrate part of the semiconductor light emitting device of the second embodiment is filled with the same under-fill; and a sample (called a third LED) in which a space between the optical emission part and the support substrate part of the semiconductor light emitting device of the third embodiment is filled with the same under-fill.

The experiments were conducted by flowing current of 20 mA through each of the three LEDs. Light was emitted by each of the LEDs for 1000 hours in the atmospheric condition, and a resulting change, if any, in the under-fill was observed by human eyes. The results are as follows. In the comparative LED, the color of a region of the under-fill around the n-side electrode of the comparative LED changed to light brown. In the second LED, only a region of the under-fill that corresponds to the electrode separation groove changed to yellow in color. No change was observed for the third LED.

It can be understood from the experiment results that the semiconductor light emitting device of the third embodiment is suitable for use with an ultra small size LED lamp or the like, because optical leak can be prevented between the p- and n-side electrodes and deterioration of the under-fill can be prevented.

The present invention has been described in connection with the preferred embodiments. The invention is not limited only to the above embodiments.

For example, in the structures of the semiconductor light emitting devices of the embodiments, a width of the electrode separation groove, a margin for electrode formation and the like can be made narrower by using stepper techniques of LSI manufacture. A wavelength of light to be emitted from the optical emission layer is not limited specifically.

Further, in this application, the term "translucent" has been used to generally indicate the property of permitting the passage of light emitted from the nitride semiconductor layer. As such, the terms "translucent member" and "translucent resin" or similar words referred to above broadly encompass a transparent insulating member and a transparent resin, respectively, as well as any member/resin that permits a passage of the light in various degrees with various light distributions, such as transparent materials with scattering agents or other light diffusers to diffuse light entering thereupon. Similarly, the term "translucency" means any ability of permitting the passage of light.

Further, in this application, the terms "layer," "member" and like expressions are not limited to a single layered structure, a single material member, and the like, and they encompass multi-layered, multi-composition/material structure and the like, respectively.

Moreover, the arrangement and the pattern of the plurality of light emission regions 196 in the first embodiment of the present invention are not limited to the disclosed rectangular matrix shape and squire shape. Various other configurations, such as the honeycomb lattice with hexagonally shaped light emission regions, are also possible depending on design needs.

It will be apparent to those skilled in the art that other various modifications, improvements, combinations, and the like can be made.

The present invention is applicable to semiconductor light emitting devices and various products using semiconductor light emitting devices.

What we claim are:

1. A semiconductor light emitting device comprising:
a substrate having translucency;
a semiconductor part formed over said substrate and comprising a first semiconductor layer of a first conductivity type over said substrate, an optical emission layer over said first semiconductor layer, and a second semiconductor layer of a second conductivity type over said optical emission layer, said semiconductor part including an optical emission region and an optical non-emission region, said optical emission region being defined inside a closed line pattern, in plan view, of a recess that downwardly extends through said second semiconductor layer and said optical emission layer and reaching said first semiconductor layer, and said optical non-emission region being separated from said optical emission region via said recess, wherein an side end of said optical non-emission region opposite to said recess has a downward slope towards said substrate in at least a portion of said side end;
an insulating transparent member embedded in said recess;
a first electrode electrically connected to said first semiconductor layer and formed on said downward slope of said side end of said optical non-emission region opposite to said recess; and
a second electrode formed on said second semiconductor layer in said optical emission region,
wherein light emitted from said optical emission layer is output generally downwardly on a side of said substrate.

2. The semiconductor light emitting device according to claim 1, wherein said first electrode is formed also on a top surface of said second semiconductor layer in said optical non-emission region.

3. The semiconductor light emitting device according to claim 1, wherein said transparent member laterally extends to cover a portion of a top surface of said second semiconductor layer and a portion of a top surface of said first electrode, and said second electrode laterally extends to cover at least a portion of a top surface of said transparent member above said recess.

4. The semiconductor light emitting device according to claim 1, wherein said transparent member laterally extends to cover a portion of a top surface of said second semiconductor layer and a portion of a top surface of said second electrode, and said first electrode laterally extends to cover at least a portion of a top surface of said transparent member above said recess.

5. The semiconductor light emitting device according to claim 1, wherein said transparent member laterally extends to cover a portion of said second semiconductor layer, a portion of said first electrode and a portion of said second electrode, and the semiconductor light emitting device further comprises an opaque member on said transparent member at least in a region above said recess.

6. The semiconductor light emitting device according to claim 5, wherein said opaque member is made of material reflecting light emitted from said optical emission layer at a perpendicular incidence reflectivity of about 60% or higher.

7. The semiconductor light emitting device according to claim 1, wherein said recess is formed to a depth of about 0.1 µm or deeper into said first semiconductor layer from an interface between said optical emission layer and said first semiconductor layer.

8. The semiconductor light emitting device according to claim 1, wherein a difference between a refractive index of said semiconductor part and a refractive index of said transparent member is about 1.1 or smaller.

9. The semiconductor light emitting device according to claim 1, wherein an angle of inclination of the downward slope of said side end of said optical non-emission region is about 35° to about 50° as measured from a surface of said substrate.

10. The semiconductor light emitting device according to claim 1, wherein an angle of inclination of the downward slope of said side end of said optical non-emission region is about 40° to about 45° as measured from a surface of said substrate.

11. The semiconductor light emitting device according to claim 1, wherein said first electrode is made of material reflecting light emitted from said optical emission layer at a perpendicular incidence reflectivity of about 60% or higher.

12. The semiconductor light emitting device according to claim 1, wherein said second electrode is made of material reflecting light emitted from said optical emission layer at a perpendicular incidence reflectivity of about 80% or higher.

13. The semiconductor light emitting device according to claim 1, wherein said first conductivity type is an n-type.

14. A semiconductor light emitting device, comprising,
a semiconductor layer having a recess extending downwardly from a top surface thereof along a pattern of a closed line so that said recess defines and encloses a region of the semiconductor layer that emits light, said semiconductor layer having a downward slope in at least a portion of its side end face located outside the closed line pattern of said recess;
a first electrode on said downward slope of the side end face of the semiconductor layer and electrically in contact with a portion of said semiconductor layer, wherein said first electrode downwardly reflects light that is emitted by said semiconductor layer and that reaches the first electrode; and
a second electrode electrically in contact with a portion of said semiconductor layer located inside the closed line pattern of said recess.

15. The semiconductor light emitting device according to claim 14, wherein the second electrode downwardly reflects light that is emitted by said semiconductor layer and that reaches the second electrode.

16. The semiconductor light emitting device according to claim 15, further comprising a translucent insulating member in said recess, the translucent insulating member having such a refractive index that light emitted by said semiconductor layer passes through said recess without substantial reflection at boundaries of said recess.

17. The semiconductor light emitting device according to claim 16, further comprising a light reflector over at least a portion of said translucent insulating member that is located above said recess to prevent stray light from outputting upwardly through said recess.

18. The semiconductor light emitting device according to claim 17, wherein the first electrode has an extension over said translucent insulating member so that the extension functions as said light reflector.

19. The semiconductor light emitting device according to claim 17, wherein the second electrode has an extension over said translucent insulating member so that the extension functions as said light reflector.

* * * * *